(12) United States Patent
Lin et al.

(10) Patent No.: US 11,961,890 B2
(45) Date of Patent: Apr. 16, 2024

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Hsin-Fu Lin, Hsinchu (TW); Chia-Ta Hsieh, Hsinchu (TW); Tsung-Hao Yeh, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 138 days.

(21) Appl. No.: 17/400,594

(22) Filed: Aug. 12, 2021

(65) Prior Publication Data
US 2023/0052949 A1 Feb. 16, 2023

(51) Int. Cl.
*H01L 29/423* (2006.01)
*H01L 29/40* (2006.01)
*H01L 29/66* (2006.01)
*H01L 29/78* (2006.01)

(52) U.S. Cl.
CPC ...... *H01L 29/42368* (2013.01); *H01L 29/401* (2013.01); *H01L 29/42376* (2013.01); *H01L 29/66681* (2013.01); *H01L 29/7816* (2013.01)

(58) Field of Classification Search
CPC ............. H01L 29/42368; H01L 29/401; H01L 29/42376; H01L 29/66681; H01L 29/7816; H01L 29/0653; H01L 29/66689
See application file for complete search history.

(56) References Cited

U.S. PATENT DOCUMENTS

| | | | |
|---|---|---|---|
| 2013/0181287 A1* | 7/2013 | Zhang | H01L 29/7816 257/E29.256 |
| 2014/0131796 A1* | 5/2014 | Zhou | H01L 29/1083 438/286 |
| 2015/0061011 A1* | 3/2015 | Cheng | H01L 29/66681 257/344 |
| 2016/0190269 A1* | 6/2016 | Brown | H01L 29/66681 438/286 |

* cited by examiner

*Primary Examiner* — Mohammed R Alam
(74) *Attorney, Agent, or Firm* — Birch, Stewart, Kolasch & Birch, LLP

(57) ABSTRACT

A semiconductor device includes a semiconductor layer and a gate structure on the semiconductor layer. The gate structure includes a multi-stepped gate dielectric on the semiconductor layer and a gate electrode on the multi-stepped gate dielectric. The multi-stepped gate dielectric includes a first gate dielectric segment having a first thickness and a second gate dielectric segment having a second thickness that is less than the first thickness.

20 Claims, 23 Drawing Sheets

SEMICONDUCTOR DEVICE AND METHOD FOR MANUFACTURING THE SAME

BACKGROUND

In semiconductor devices, such as metal oxide semiconductor field effect transistors (MOSFETs), an excess of hot carriers may degrade reliability, induce high leakage current, or cause malfunction of the MOSFETs. Hence, there is a need to solve this problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
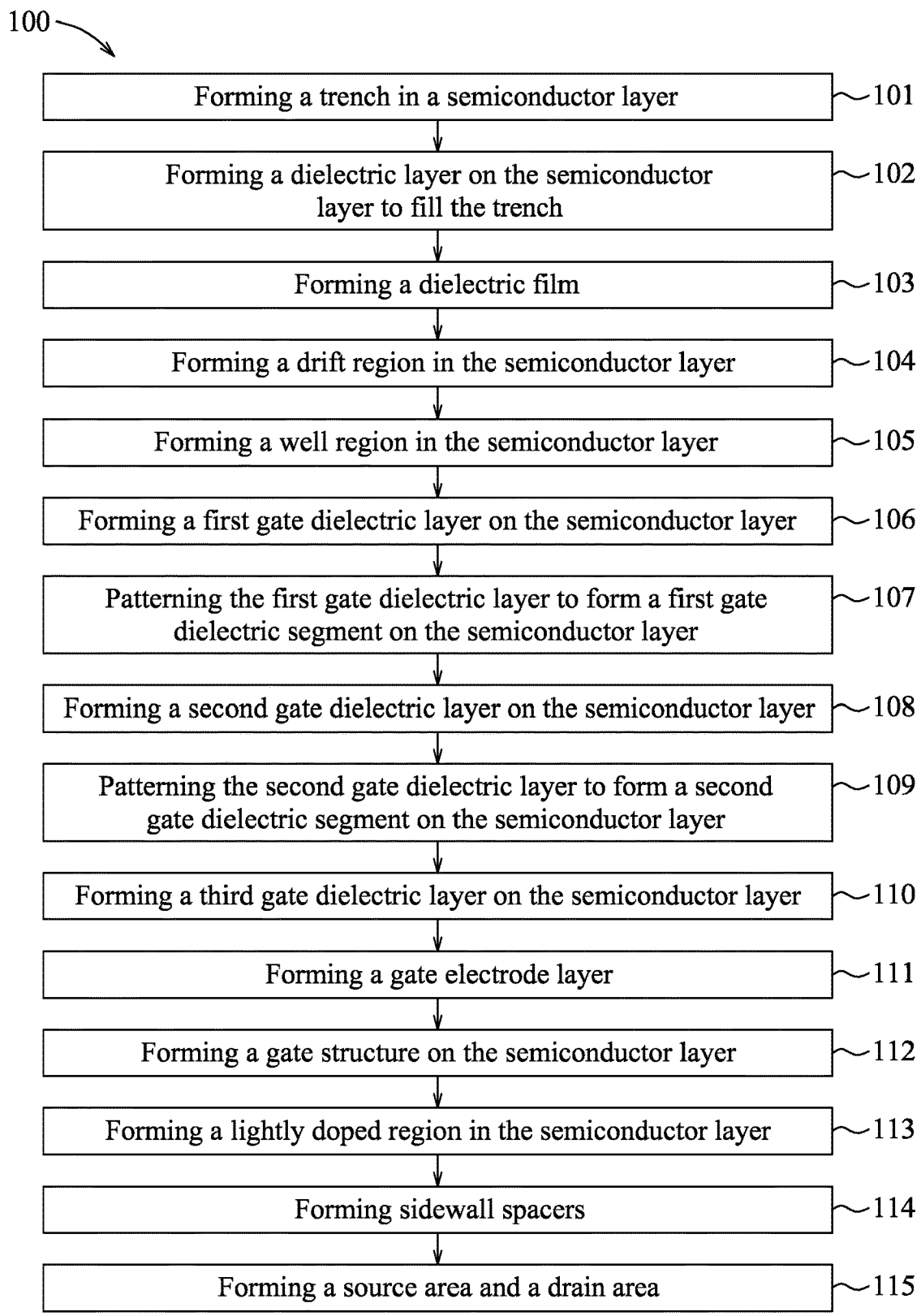
FIG. 1 is a flow diagram illustrating a method for manufacturing a semiconductor device in accordance with some embodiments.
Figure 2:
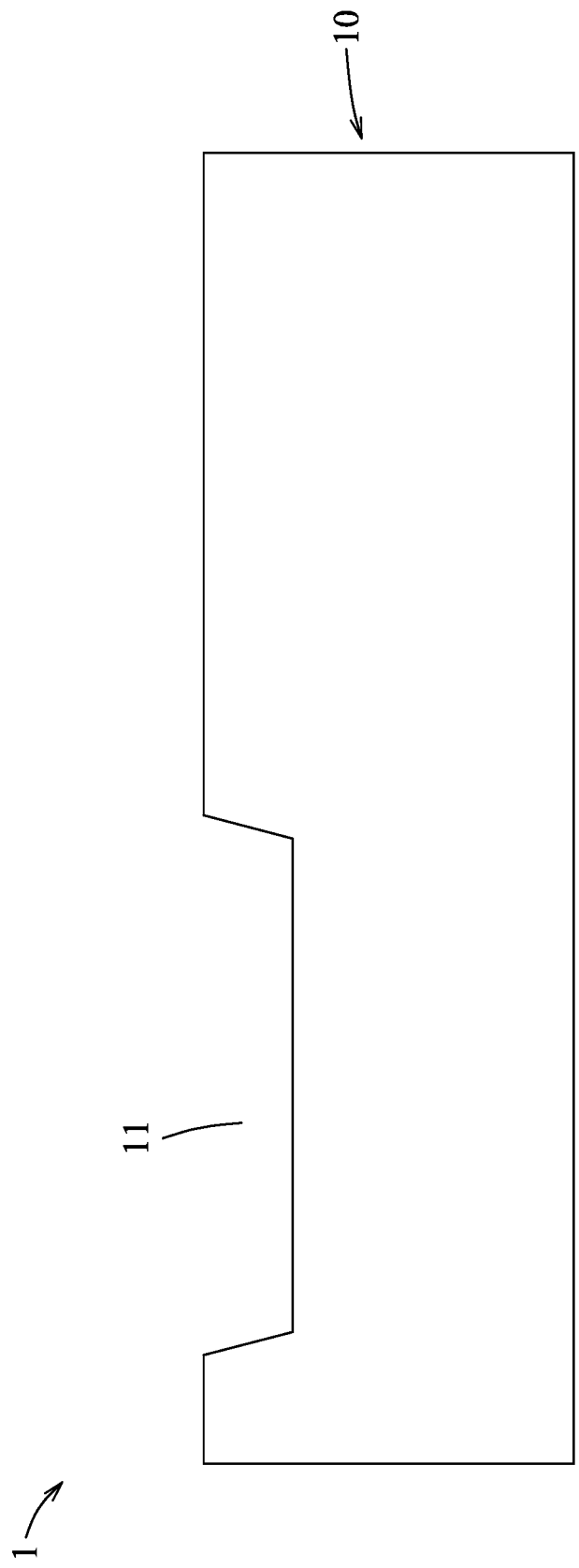
FIGS. 2 to 21 are schematic views illustrating intermediate stages of a method for manufacturing the semiconductor device in accordance with some embodiments as depicted in FIG. 1.
Figure 3:
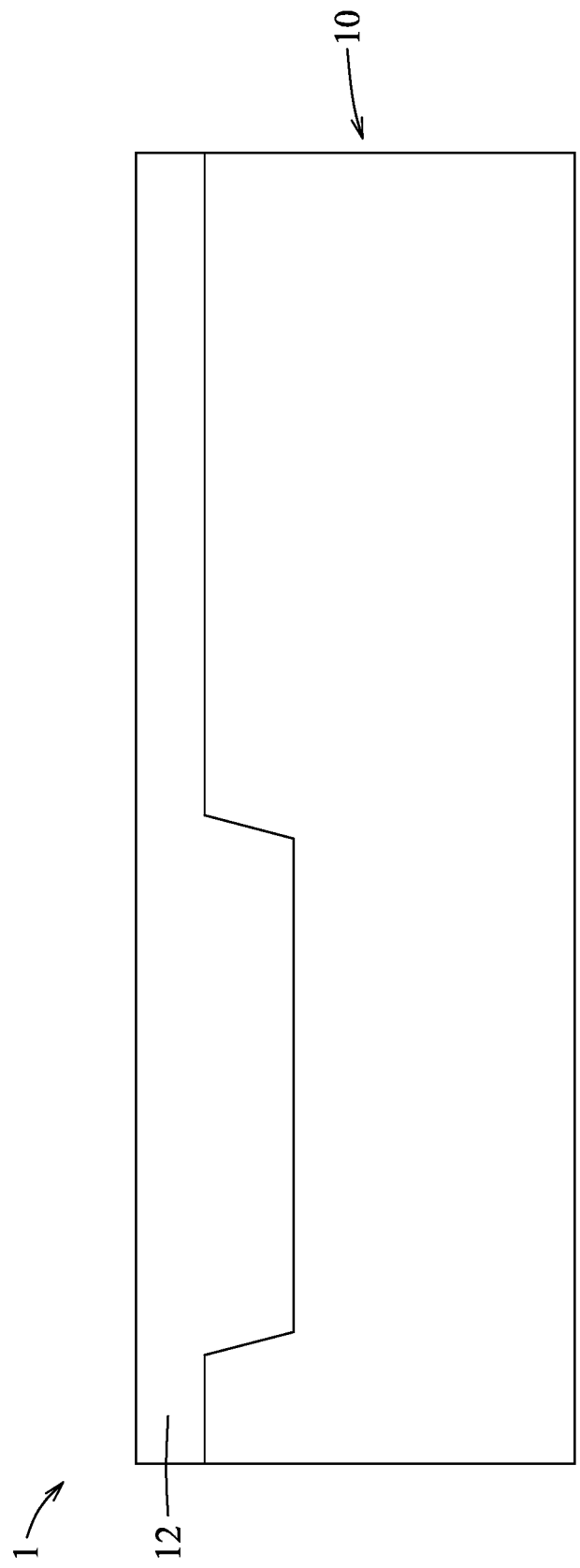
Figure 4:
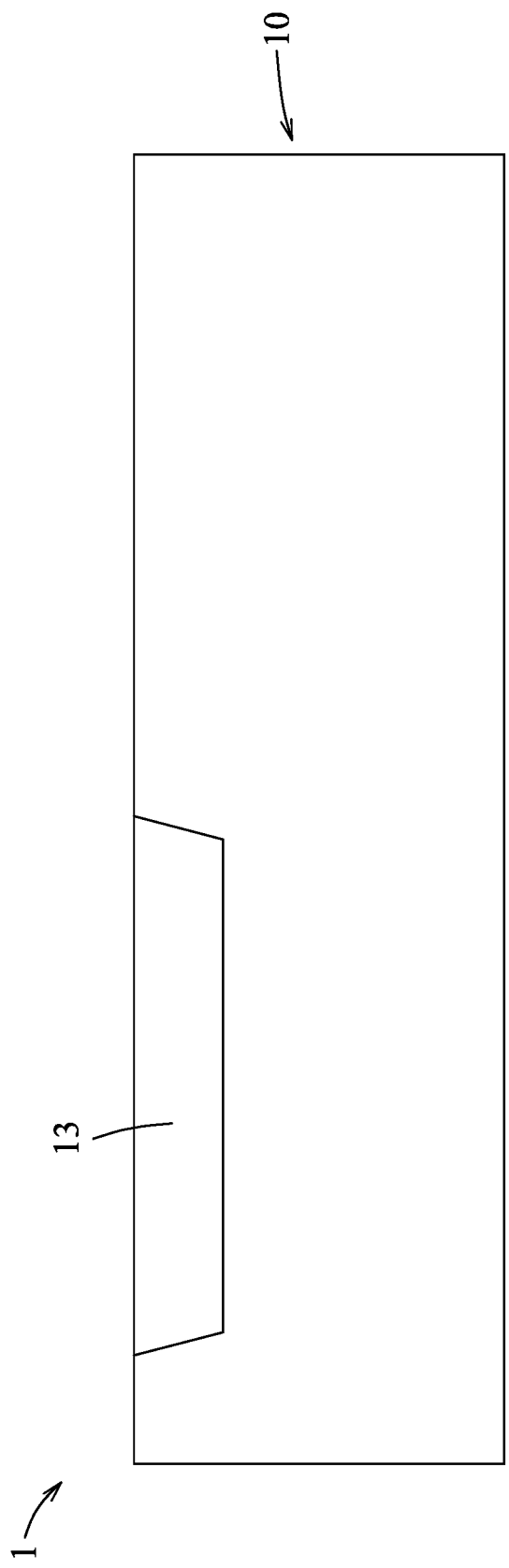
Figure 5:
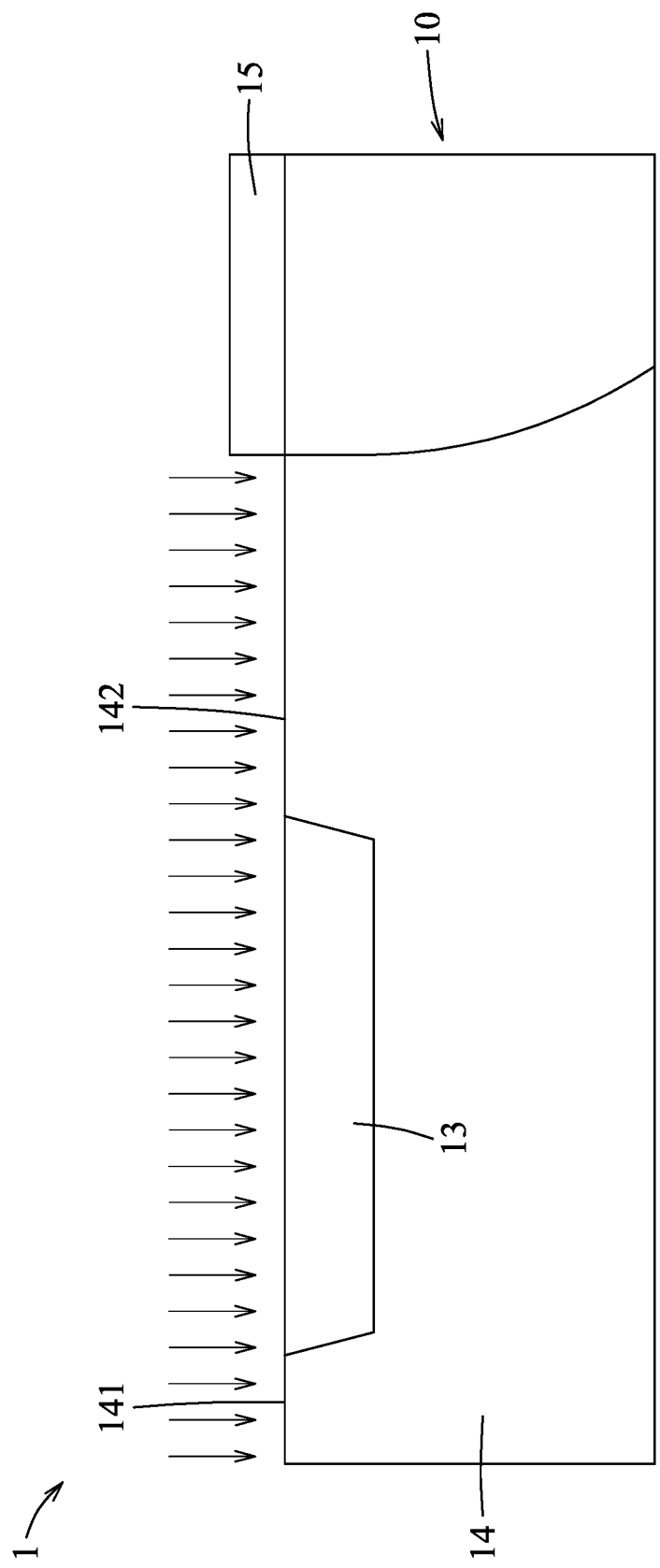
Figure 6:
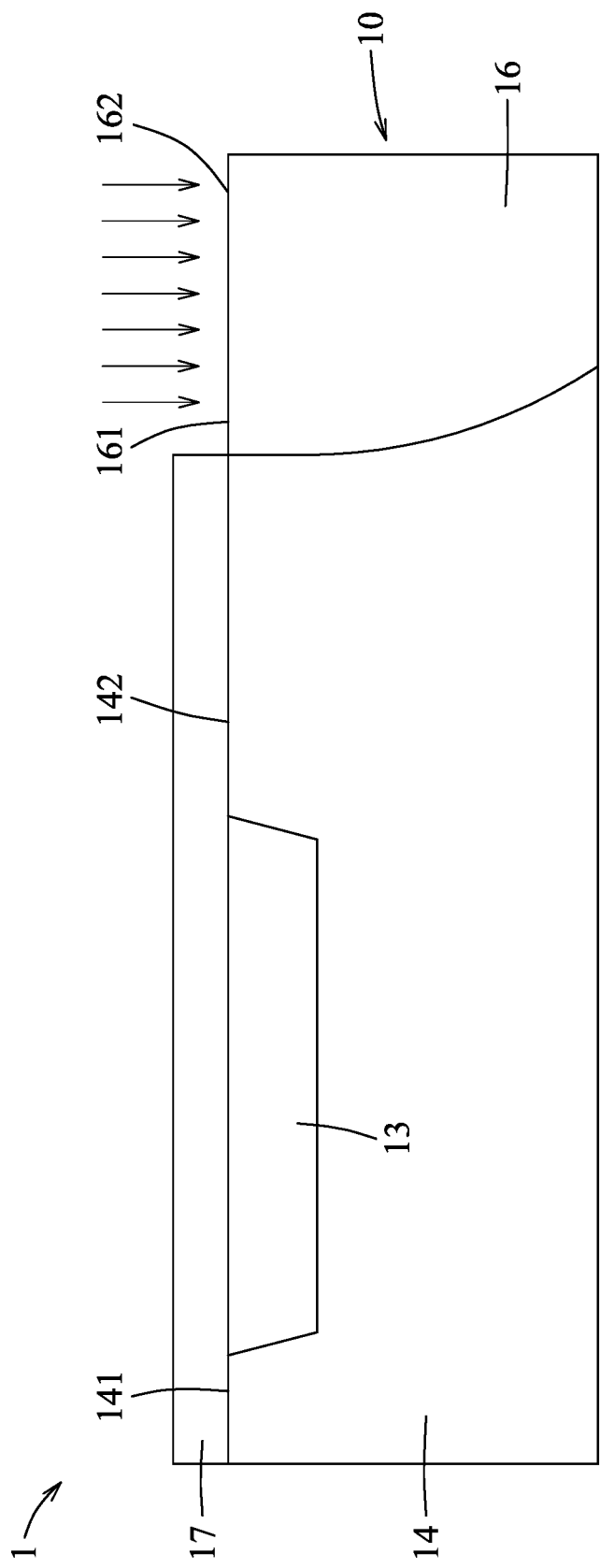
Figure 7:
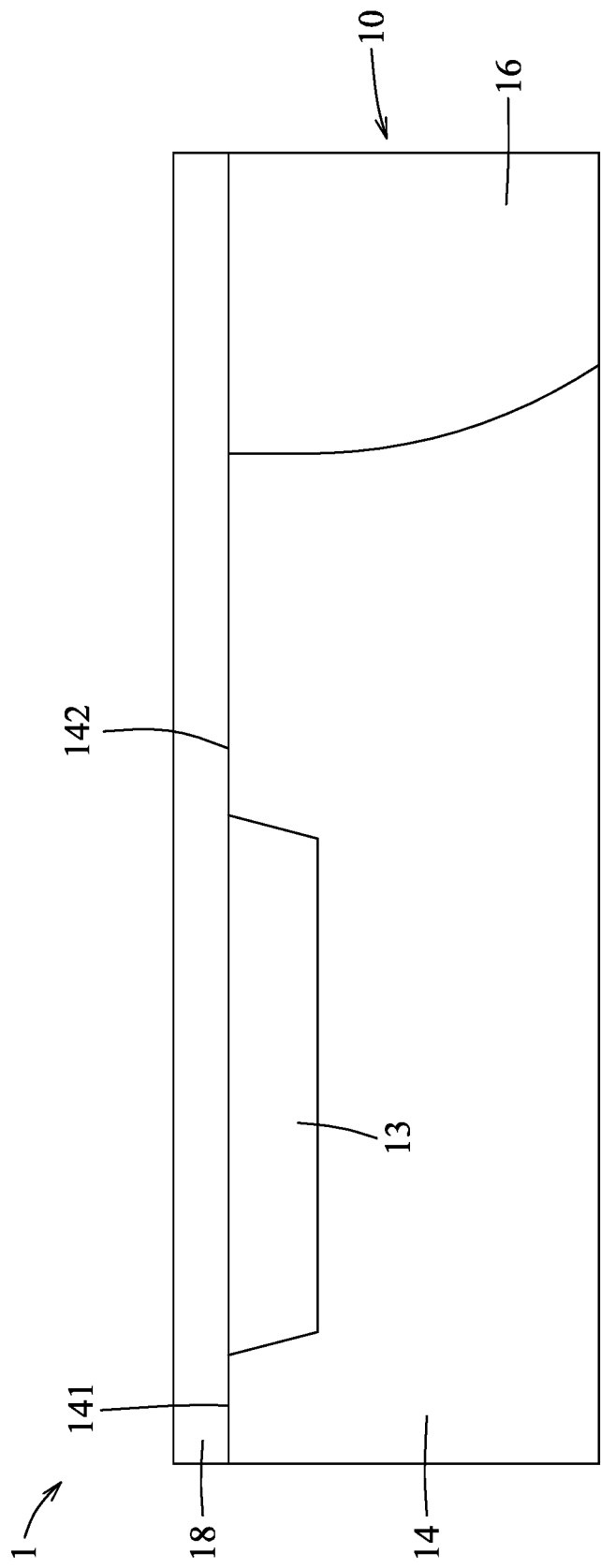
Figure 8:
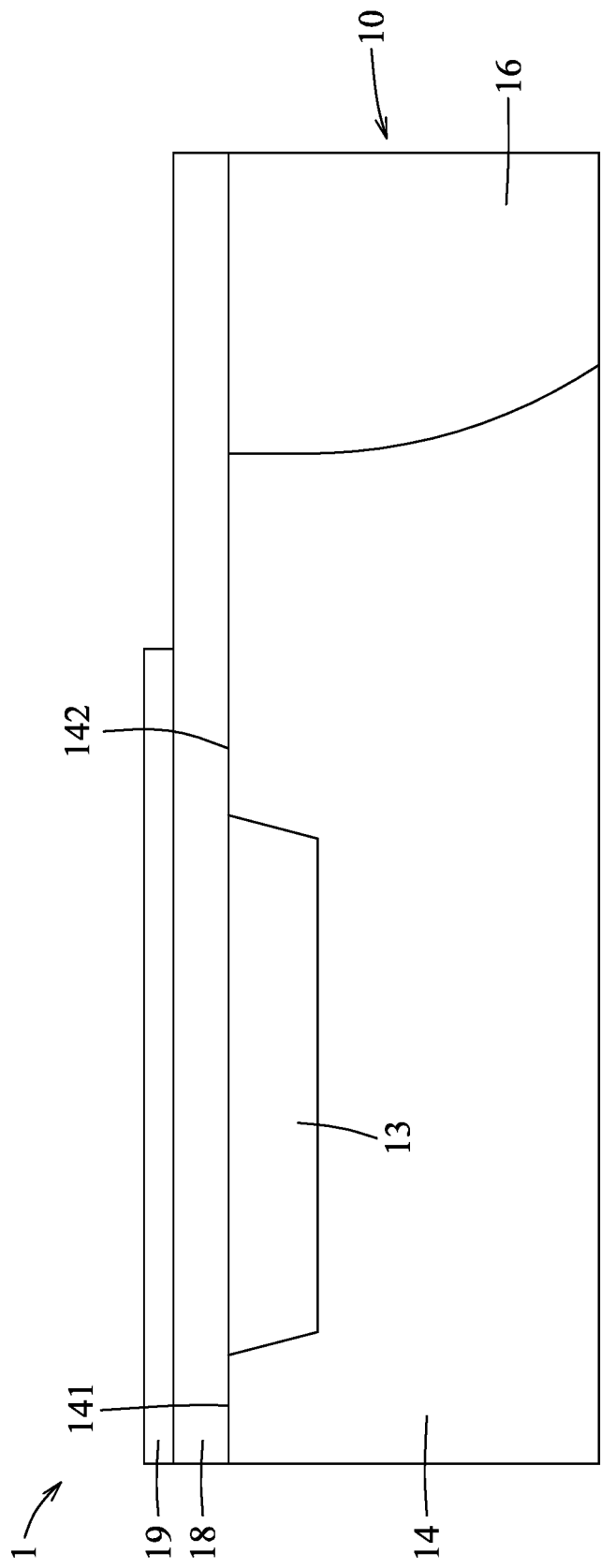
Figure 9:
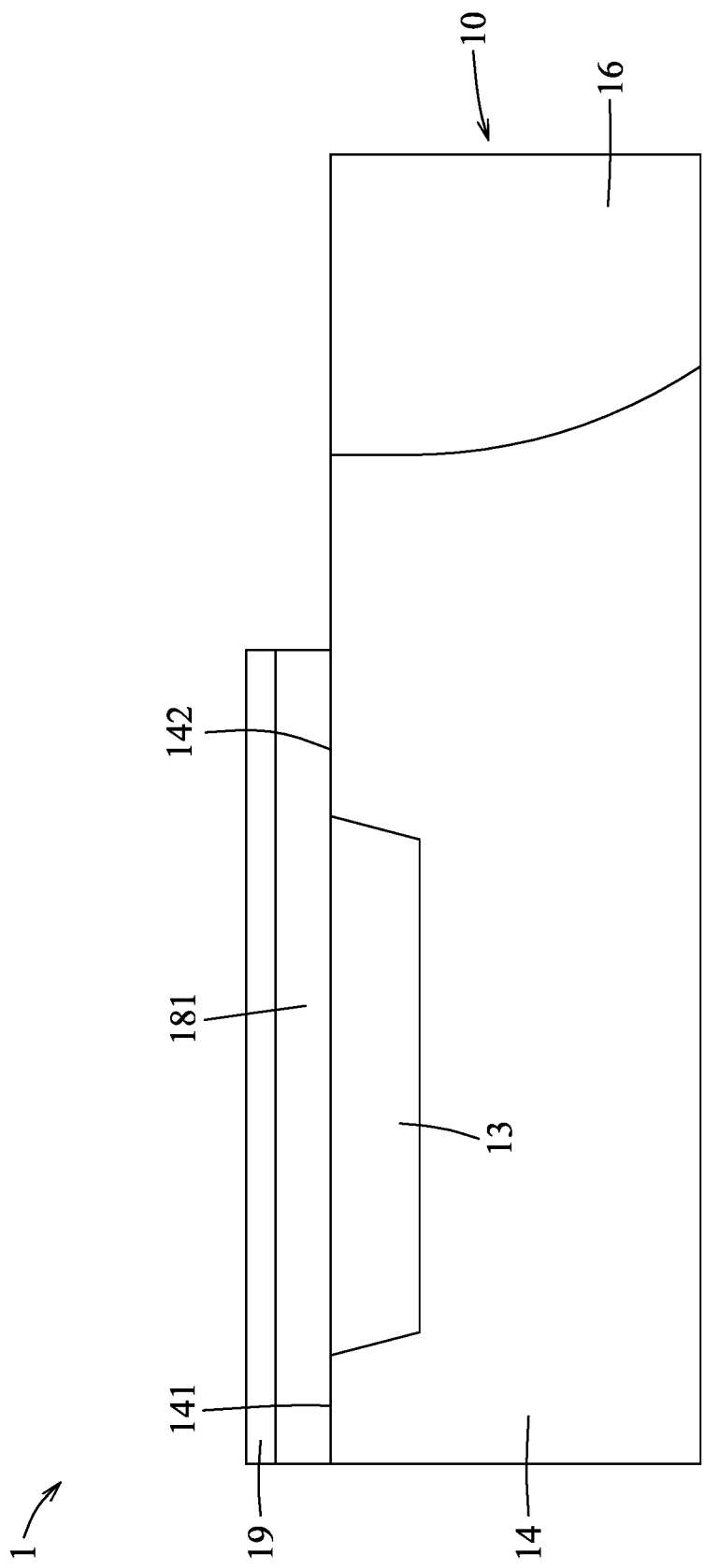
Figure 10:
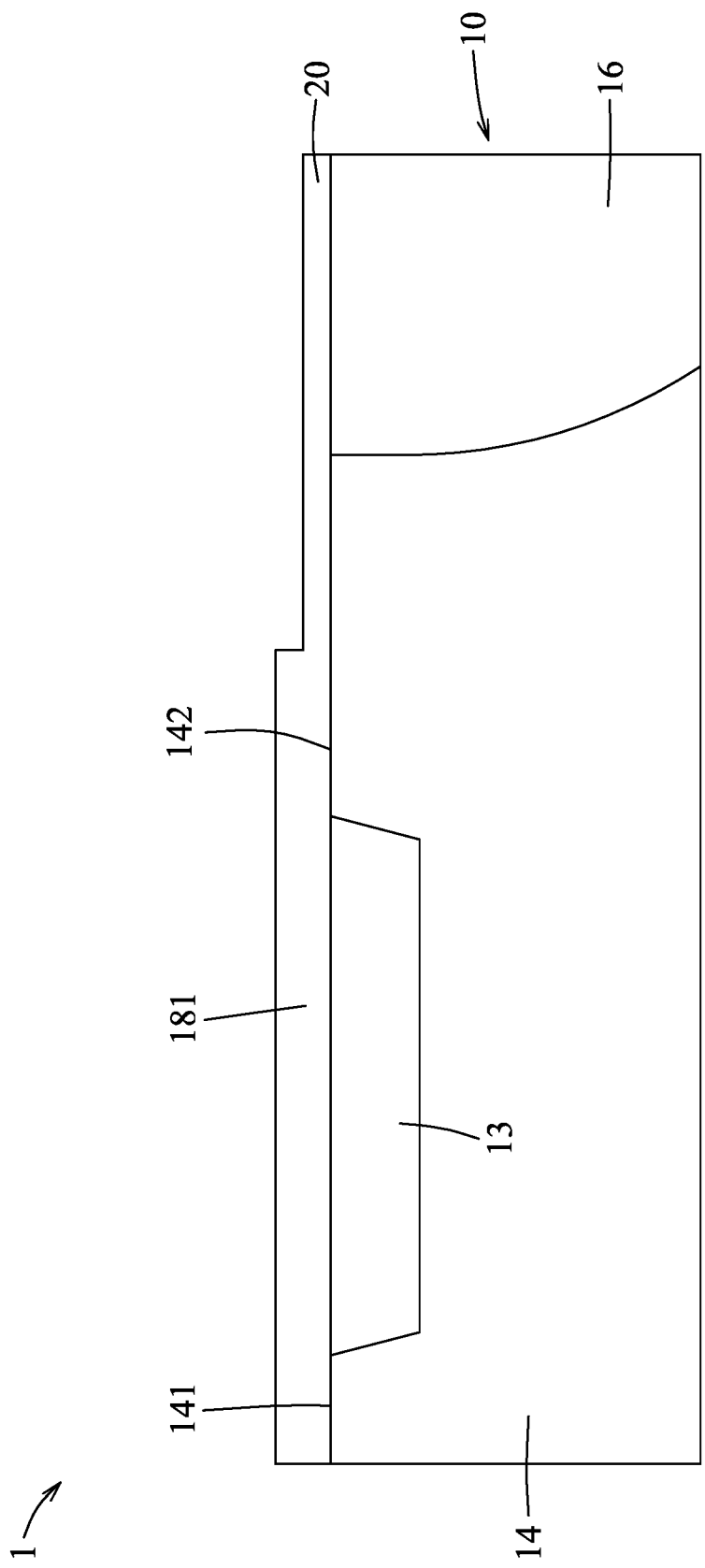
Figure 11:
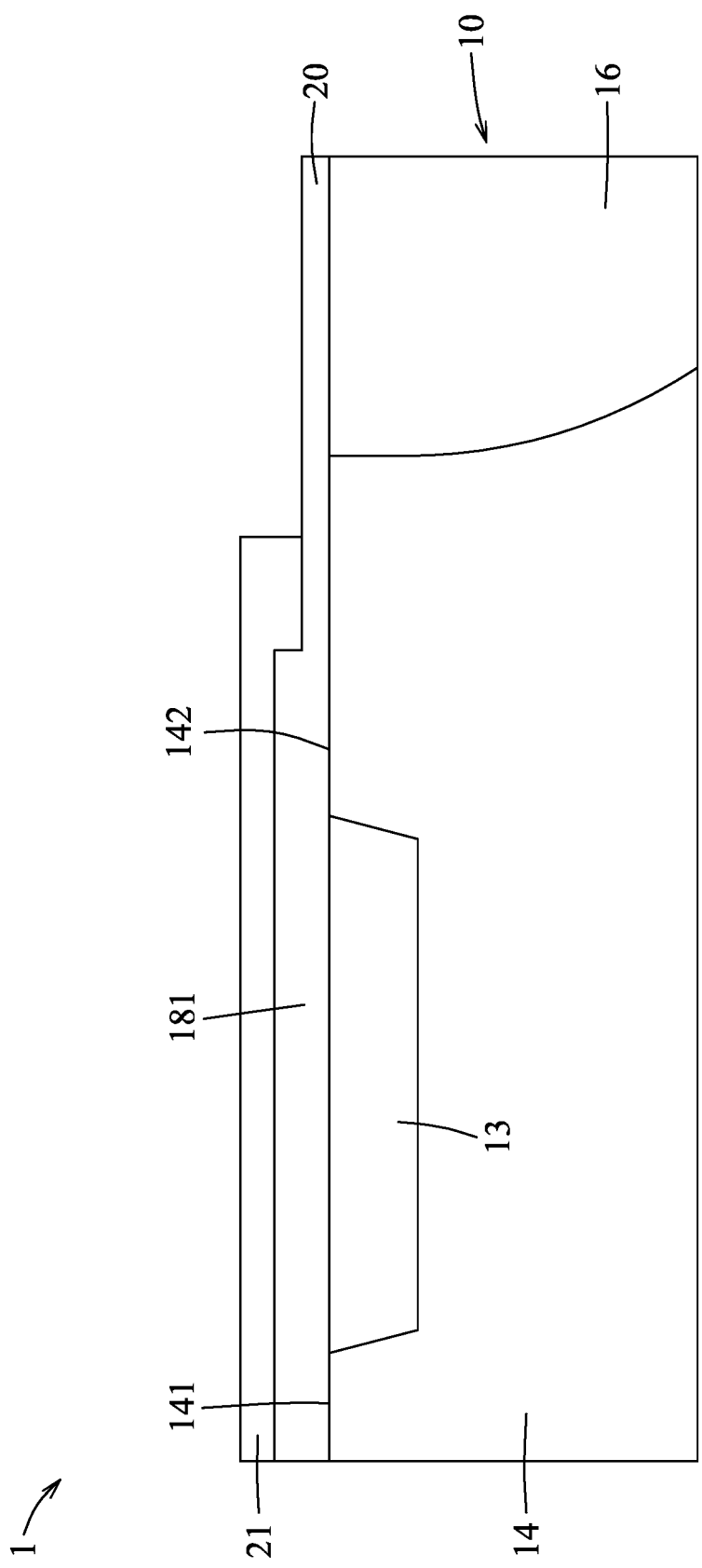
Figure 12:
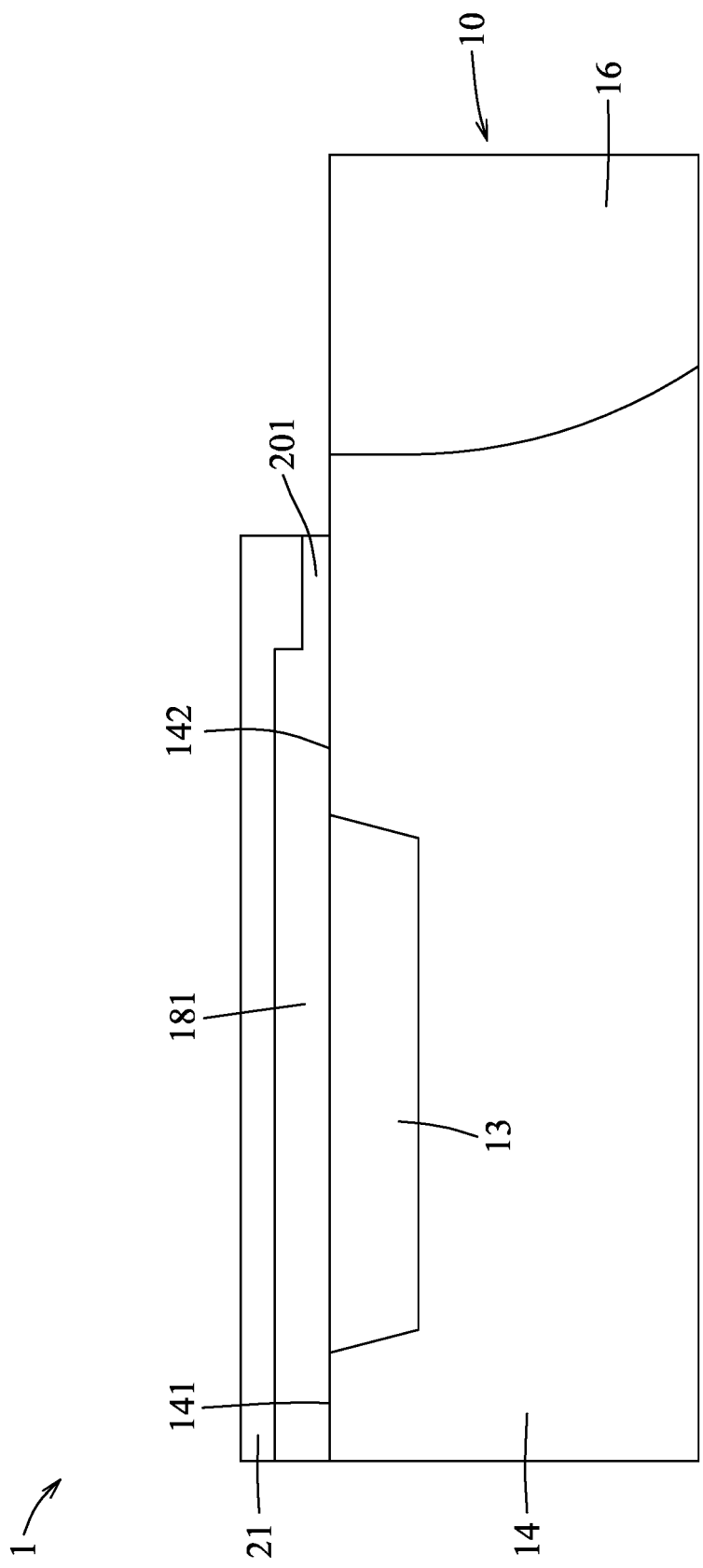
Figure 13:
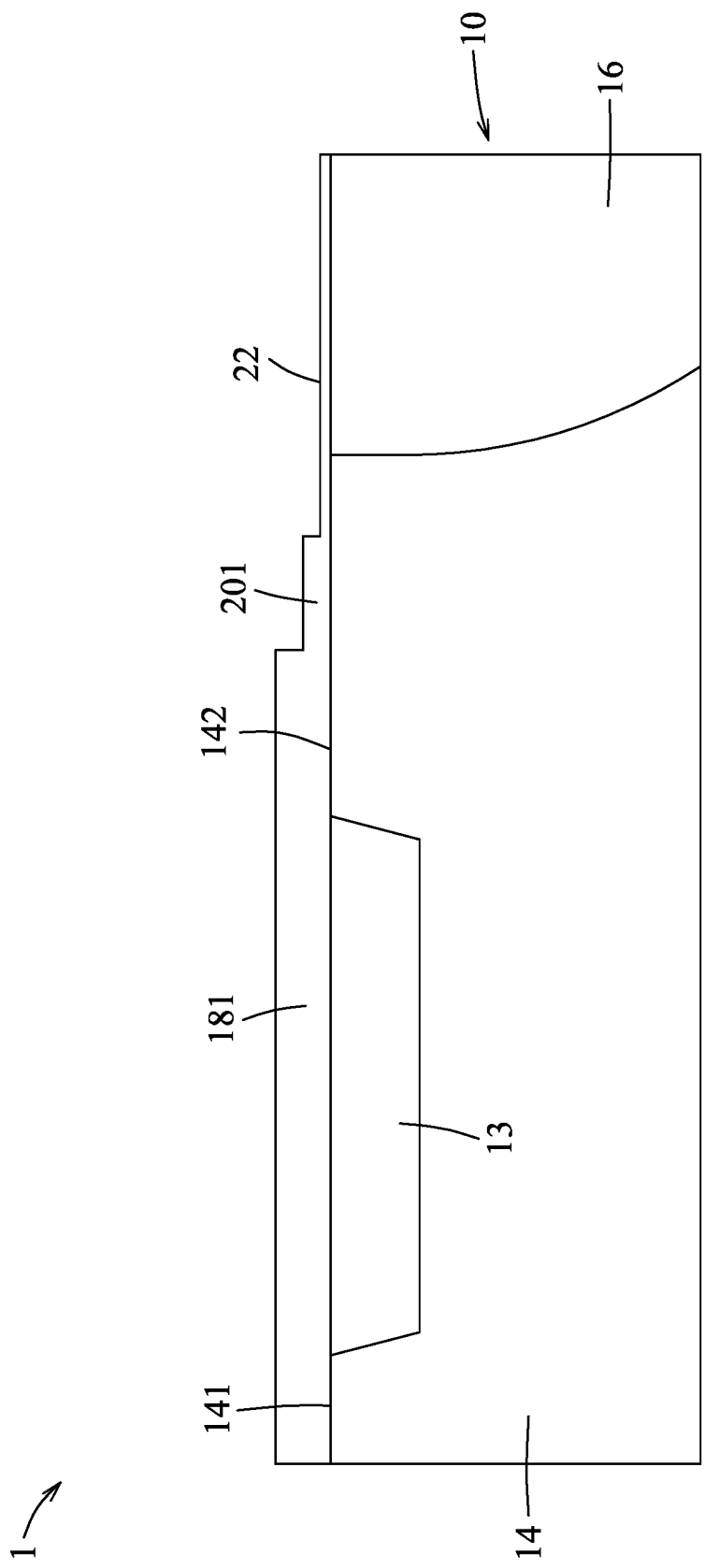
Figure 14:
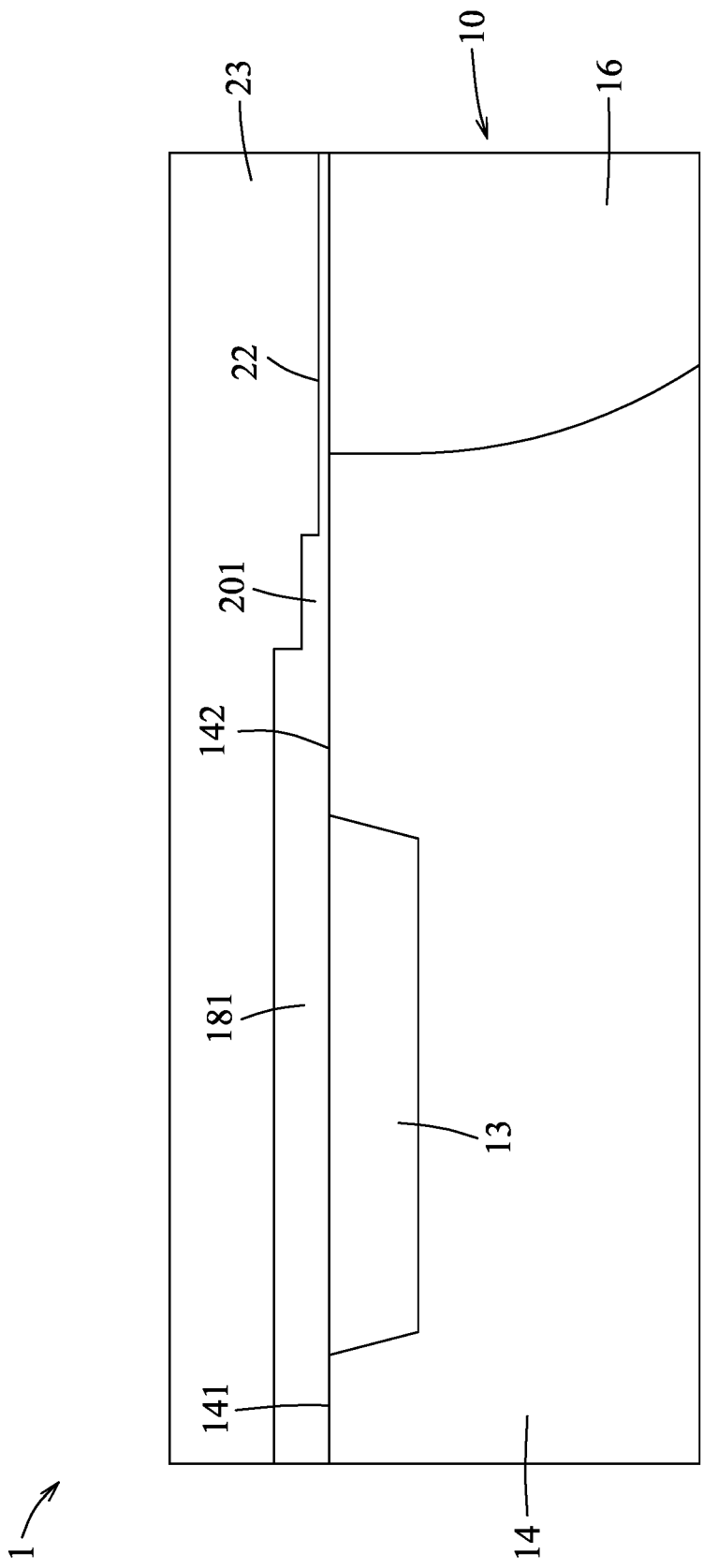
Figure 15:
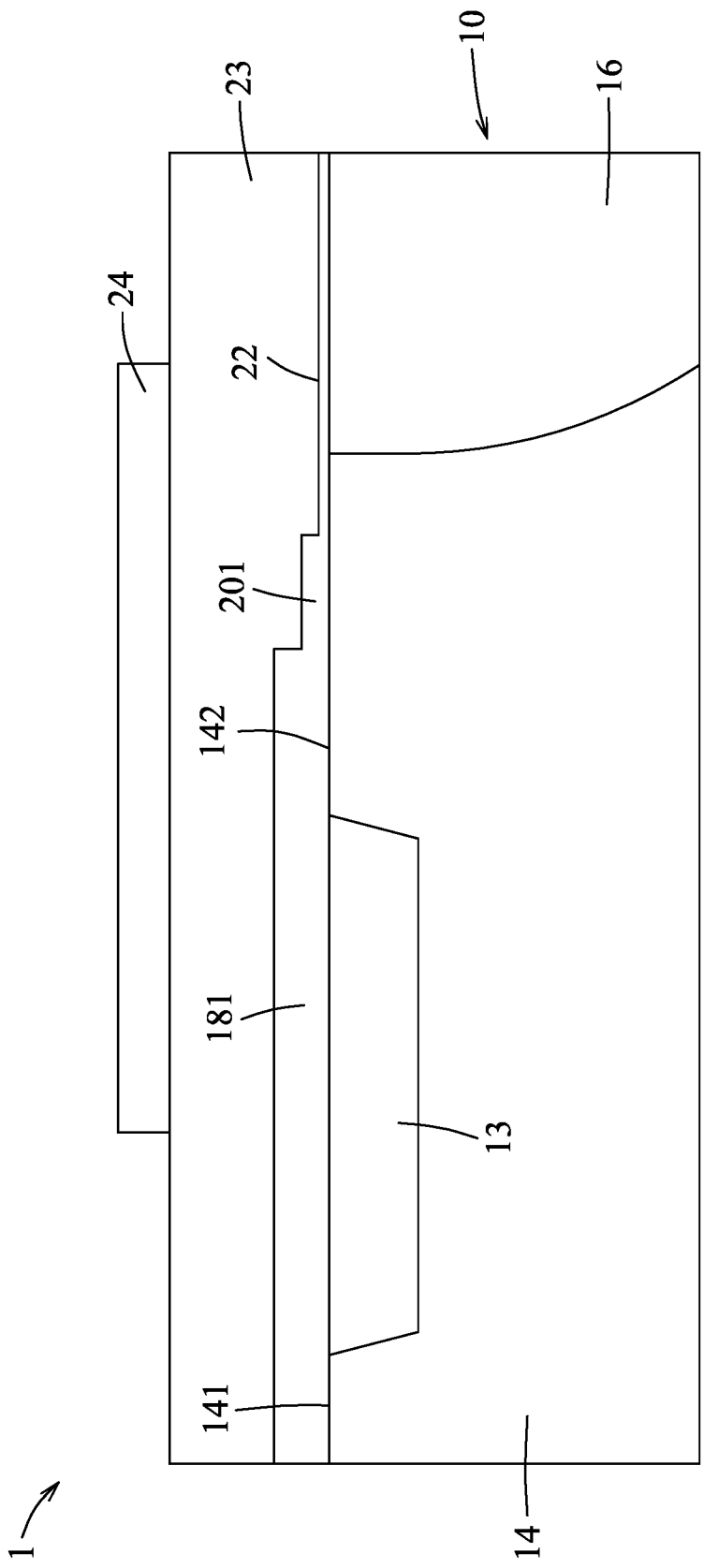
Figure 16:
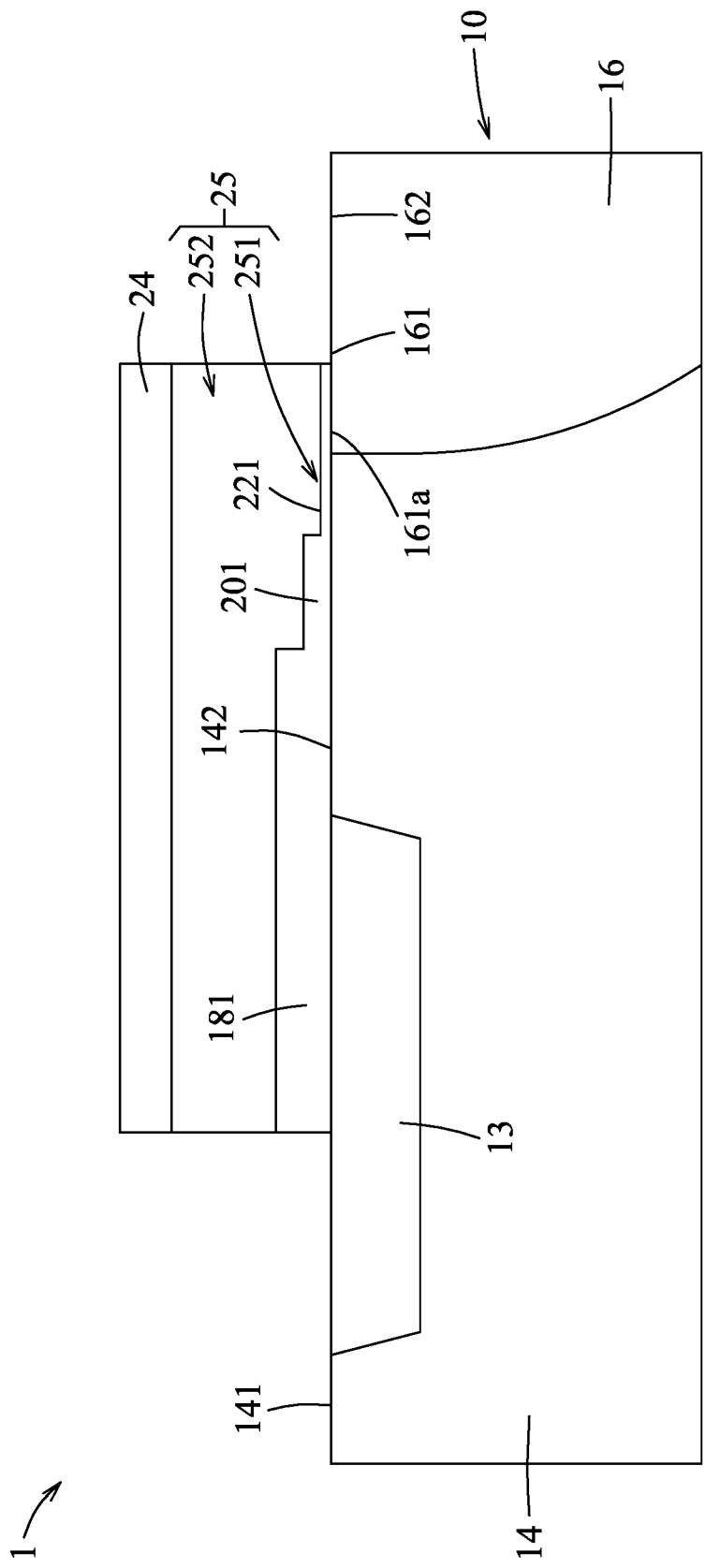

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "proximate," "distal," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices and methods for manufacturing the same. The semiconductor devices may be, but not limited to, power MOSFETs, which may be bipolar complementary metal-oxide semiconductor (bipolar CMOS) diffusion metal-oxide semiconductor (DMOS) devices (bipolar-CMOS-DMOS (BCD) devices), for example, LDMOS transistors (lateral diffused metal oxide semiconductor field effect transistors) or other suitable transistors/power devices.

FIG. 1 is a flow diagram illustrating a method 100 for manufacturing a semiconductor device in accordance with some embodiments. FIGS. 2 to 21 illustrate schematic views of a semiconductor device 1 during various stages of the method 100 shown in FIG. 1. The method 100 and the semiconductor device 1 are collectively described below. However, additional steps can be provided before, after or during the various stages of the method 100, and some of the steps described herein may be replaced by other steps or be eliminated. Similarly, further additional features may be present in the semiconductor device 1, and/or the features present may be replaced or eliminated in additional embodiments.

Referring to FIG. 1, the method 100 begins at block 101, where a trench is formed in a semiconductor layer. Referring to the example illustrated in FIG. 2, a trench 11 is formed in a semiconductor layer 10. In some embodiments, the semiconductor layer 10 may include crystalline silicon, polycrystalline silicon, or a combination thereof. Other suitable semiconductor materials are within the contemplated scope of the present disclosure. The trench 11 may be formed using a photolithography process and an etching process. The photolithography process may include, for example, but not limited to, coating a photoresist (not shown), soft-baking, exposing the photoresist through a photomask, post-exposure baking, and developing the photoresist, followed by hard-baking so as to form a patterned photoresist on the semiconductor layer 10. The etching process may be implemented by etching the semiconductor layer 10 through the patterned photoresist using, for example, but not limited to, a dry etching process, a wet etching process, other suitable processes, or combinations thereof.

Referring to FIG. 1, the method 100 then proceeds to block 102, where a dielectric layer is formed on the semiconductor layer to fill the trench. Referring to the examples illustrated in FIGS. 2 and 3, a dielectric layer 12 is formed on the semiconductor layer 10 to fill the trench 11. The dielectric layer 12 may include, but not limited to, silicon oxide, silicon nitride, silicon oxynitride, or combinations thereof. Other suitable dielectric materials are within the contemplated scope of the present disclosure. The dielectric layer 12 may be deposited by, for example, but not limited to, sputtering, chemical vapor deposition (CVD), plasma-enhanced CVD (PECVD), physical vapor deposition (PVD), or other suitable processes.

Referring to FIG. 1, the method 100 then proceeds to block 103, where a dielectric film is formed. Referring to the examples illustrated in FIGS. 3 and 4, a planarization process is conducted to remove an excess of the dielectric layer 12 and to expose the semiconductor layer 10 so as to obtain a dielectric film 13. The dielectric film 13 may also be referred to as a shallow trench isolation (STI) region. It should be noted that the planarization process may be implemented using a chemical mechanical polishing (CMP) process or other suitable techniques and that other suitable processes may be used for formation of the STI region 13.

Referring to FIG. 1, the method 100 then proceeds to block 104, where a drift region is formed in the semiconductor layer. Referring to the example illustrated in FIG. 5, a drift region 14 is formed in the semiconductor layer 10. Formation of the drift region 14 may be implemented by (i) forming a patterned mask 15 on the semiconductor layer 10 to expose the STI region 13 and a surrounding surface of the semiconductor layer 10 around the STI region 13, and (ii) doping the semiconductor layer 10 through the patterned mask 15 using an ion implantation process or other suitable processes so as to form the drift region 14. In some embodiments, the patterned mask 15 may be a patterned photoresist, which is formed by coating a photoresist (not shown), soft-baking, exposing the photoresist through a photomask, post-exposure baking, and developing the photoresist, followed by hard-baking so as to form the patterned photoresist on the semiconductor layer 10. In some alternative embodiments, the patterned mask 15 may be a patterned hard mask. After the drift region 14 is formed, the patterned mask 15 may be removed. In some embodiments, the drift region 14 may be formed using an N-type dopant for forming an N-type MOS device. The N-type dopant may include, for example, but not limited to, arsenic, phosphorus, the like, or combinations thereof. Other suitable N-type dopants are within the contemplated scope of the present disclosure. In some embodiments, the drift region 14 may be formed using a P-type dopant for forming a P-type MOS device. The P-type dopant may include, for example, but not limited to, boron, $BF_2$, indium, the like, or combinations thereof. Other suitable P-type dopants are within the contemplated scope of the present disclosure. In some embodiments, an upper surface of the drift region 14 (which corresponds to the surrounding surface of the semiconductor layer 10 mentioned above) may have a first surface portion 141 and a second surface portion 142 which are located at two opposite sides of the STI region 13. Other suitable processes may be used for formation of the drift region 14.

Referring to FIG. 1, the method 100 then proceeds to block 105, where a well region is formed in the semiconductor layer. Referring to the example illustrated in FIG. 6, a well region 16 is formed in the semiconductor layer 10. Formation of the well region 16 may be implemented by (i) forming a patterned mask 17 on the semiconductor layer 10 to cover the STI region 13 and the drift region 14, and (ii) doping the semiconductor layer 10 through the patterned mask 17 using an ion implantation process or other suitable processes so as to form the well region 16. In some embodiments, the patterned mask 17 may be a patterned photoresist, which is formed by the process described above for the formation of the patterned photoresist used as the patterned mask 15 referred to FIG. 5. In some alternative embodiments, the patterned mask 17 may be a patterned hard mask. After the well region 16 is formed, the patterned mask 17 may be removed. The drift region 14 has a first conductivity type, and the well region 16 has a second conductivity type opposite the first conductivity type. Therefore, in some embodiments, the well region 16 may be formed using the above-mentioned P-type dopant for forming the N-type MOS device, or using the above-mentioned N-type dopant for forming the P-type MOS device. In some embodiments, an upper surface of the well region 16 may have a first surface portion 161 and a second surface portion 162 which are proximate to and distal from the STI region 13, respectively. Other suitable processes may be used for formation of the well region 16.

Referring to FIG. 1, the method 100 then proceeds to block 106, where a first gate dielectric layer is formed on the semiconductor layer. Referring to the example illustrated in FIG. 7, a first gate dielectric layer 18 is formed on the semiconductor layer 10. The first gate dielectric layer 18 may be formed on the semiconductor layer 10 by a suitable process, which includes CVD, PVD, atomic layer deposition (ALD), high density plasma CVD (HDPCVD), metal organic CVD (MOCVD), remote plasma CVD (RPCVD), PECVD, plating, other suitable methods, and combinations thereof. The first gate dielectric layer 18 may be made of a dielectric material, for example, but not limited to, silicon oxide, silicon oxynitride, silicon nitride, spin-on glass (SOG), fluorinated silica glass (FSG), carbon doped silicon oxide, BLACK DIAMOND® (Applied Materials of Santa Clara, Calif.), XEROGEL, AEROGEL, amorphous fluorinated carbon, Parlyene, BCB (bis-benzocyclobutenes), SILK® (Dow Chemical, Midland, Mich.), polyimide, other suitable dielectric materials, or combinations thereof. In addition, the first gate dielectric layer 18 may include a high-k dielectric material, such as $HfO_2$, HfSiO, HfSiON, HfTaO, HfTiO, HfZrO, other suitable high-k dielectric materials, or combinations thereof. The first gate dielectric layer 18 may further include an interfacial layer, which comprises a grown silicon oxide layer (e.g., thermal oxide or chemical oxide) or silicon oxynitride (SiON).

Referring to FIG. 1, the method 100 then proceeds to block 107, where the first gate dielectric layer is patterned to form a first gate dielectric segment on the semiconductor layer. Referring to the examples illustrated in FIGS. 8 and 9, a patterned mask 19 is formed on a portion of the first gate dielectric layer 18. In some embodiments, the patterned mask 19 may be a patterned photoresist, which is formed by the process described above for the formation of the patterned photoresist used as the patterned mask 15 referred to FIG. 5. In some alternative embodiments, the patterned mask 19 may be a patterned hard mask. After the patterned mask 19 is formed on the first gate dielectric layer 18, the first gate dielectric layer 18 is patterned using an etching process to form a first gate dielectric segment 181 on the semiconductor layer 10. The etching process may be implemented by etching the first gate dielectric layer 18 through the patterned mask 19 using, for example, but not limited to, a dry etching process, a wet etching process, other suitable processes, or combinations thereof. After the first gate dielectric segment 181 is formed on the semiconductor layer 10, the patterned mask 19 may be removed.

Referring to FIG. 1, the method 100 then proceeds to block 108, where a second gate dielectric layer is formed on the semiconductor layer. Referring to the example illustrated in FIG. 10, a second gate dielectric layer 20 is formed on the semiconductor layer 10 and is physically connected to the first gate dielectric segment 181. Details regarding the material and the formation of the second gate dielectric layer 20 are the same or similar to those described above for the material and the formation of the first gate dielectric layer 18 referred to FIG. 7. The thickness of the first gate dielectric segment 181 will only be increased insignificantly during formation of the second gate dielectric layer 20, this is due to the deposition of the dielectric material on the first gate dielectric segment 181 being significantly less than the deposition of the dielectric material on the semiconductor layer 10. The second gate dielectric layer 20 thus formed is physically connected to the first gate dielectric segment 181 and has a thickness less than that of the first gate dielectric segment 181.

Referring to FIG. 1, the method 100 then proceeds to block 109, where the second gate dielectric layer is patterned to form a second gate dielectric segment on the semiconductor layer. Referring to the examples illustrated in FIGS. 11 and 12, a patterned mask 21 is formed on the first gate dielectric segment 181 and a portion of the second gate dielectric layer 20 proximate to the first gate dielectric segment 181. In some embodiments, the patterned mask 21 may be a patterned photoresist, which is formed by the process described above for the formation of the patterned photoresist used as the patterned mask 15 referred to FIG. 5. In some alternative embodiments, the patterned mask 21 may be a patterned hard mask. After the patterned mask 21 is formed on the first gate dielectric segment 181 and the portion of the second gate dielectric layer 20, the second gate dielectric layer 20 is patterned using an etching process to form a second gate dielectric segment 201 on the semiconductor layer 10. The etching process may be implemented by etching the second gate dielectric layer 20 through the patterned mask 21 using, for example, but not limited to, a dry etching process, a wet etching process, other suitable processes, or combinations thereof. After the second gate dielectric segment 201 is formed on the semiconductor layer 10, the patterned mask 21 may be removed.

Referring to FIG. 1, the method 100 then proceeds to block 110, where a third gate dielectric layer is formed on the semiconductor layer. Referring to the example illustrated in FIG. 13, a third gate dielectric layer 22 is formed on the semiconductor layer 10 and is physically connected to the second gate dielectric segment 201. Details regarding the material and the formation of the third gate dielectric layer 22 are the same or similar to those described above for the material and the formation of the first gate dielectric layer 18 referred to FIG. 7. The thicknesses of the first and second gate dielectric segments 181, 201 will only be increased insignificantly during the formation of the third gate dielectric layer 22. This is due to the deposition of the dielectric material on the first and second gate dielectric segments 181, 201 being significantly less than the deposition of the dielectric material on the semiconductor layer 10. The third gate dielectric layer 22 thus formed is physically connected to the second gate dielectric segment 201 and has a thickness less than that of the second gate dielectric segment 201.

Referring to FIG. 1, the method 100 then proceeds to block 111, where a gate electrode layer is formed. Referring to the example illustrated in FIG. 14, a gate electrode layer 23 is formed on the first gate dielectric segment 181, the second gate dielectric segment 201, and the third gate dielectric layer 22 to have a suitable thickness by a suitable process, which includes CVD, PVD, ALD, HDPCVD, MOCVD, RPCVD, PECVD, plating, other suitable methods, and combinations thereof. The gate electrode layer 23 may include, for example, but not limited to, a metallic material, a metal compound, polycrystalline silicon, or doped silicon. Other suitable gate electrode materials are within the contemplated scope of the present disclosure. The metallic material may include, for example, but not limited to, silver, aluminum, copper, tungsten, nickel, other suitable materials, alloys thereof, or combinations thereof. The metal compound may include, for example, but not limited to, titanium nitride, tantalum nitride, metal silicide, other suitable materials, or combinations thereof.

Referring to FIG. 1, the method 100 then proceeds to block 112, where a gate structure is formed on the semiconductor layer. Referring to the examples illustrated in FIGS. 15 and 16, a patterned mask 24 is formed on the gate electrode layer 23. In some embodiments, the patterned mask 24 may be a patterned photoresist, which is formed by the process described above for the formation of the patterned photoresist used as the patterned mask 15 referred to FIG. 5. In some alternative embodiments, the patterned mask 24 may be a patterned hard mask. After the patterned mask 24 is formed on the gate electrode layer 23, a gate structure 25 is formed on the semiconductor layer 10 using an etching process. The etching process may be implemented by etching the gate electrode layer 23, the first gate dielectric segment 181, and the third gate dielectric layer 22 through the patterned mask 24 using, for example, but not limited to, a dry etching process, a wet etching process, other suitable processes, or combinations thereof. After the gate structure 25 is formed on the semiconductor layer 10, the patterned mask 24 may be removed. In some embodiments, the gate structure 25 may be formed over a portion of the STI region 13, the second surface portion 142 of the drift region 14, and a part 161a of the first surface portion 161 of the well region 16 proximate to the drift region 14. Other suitable processes may be also used for forming the gate structure 25.

Figure 17:
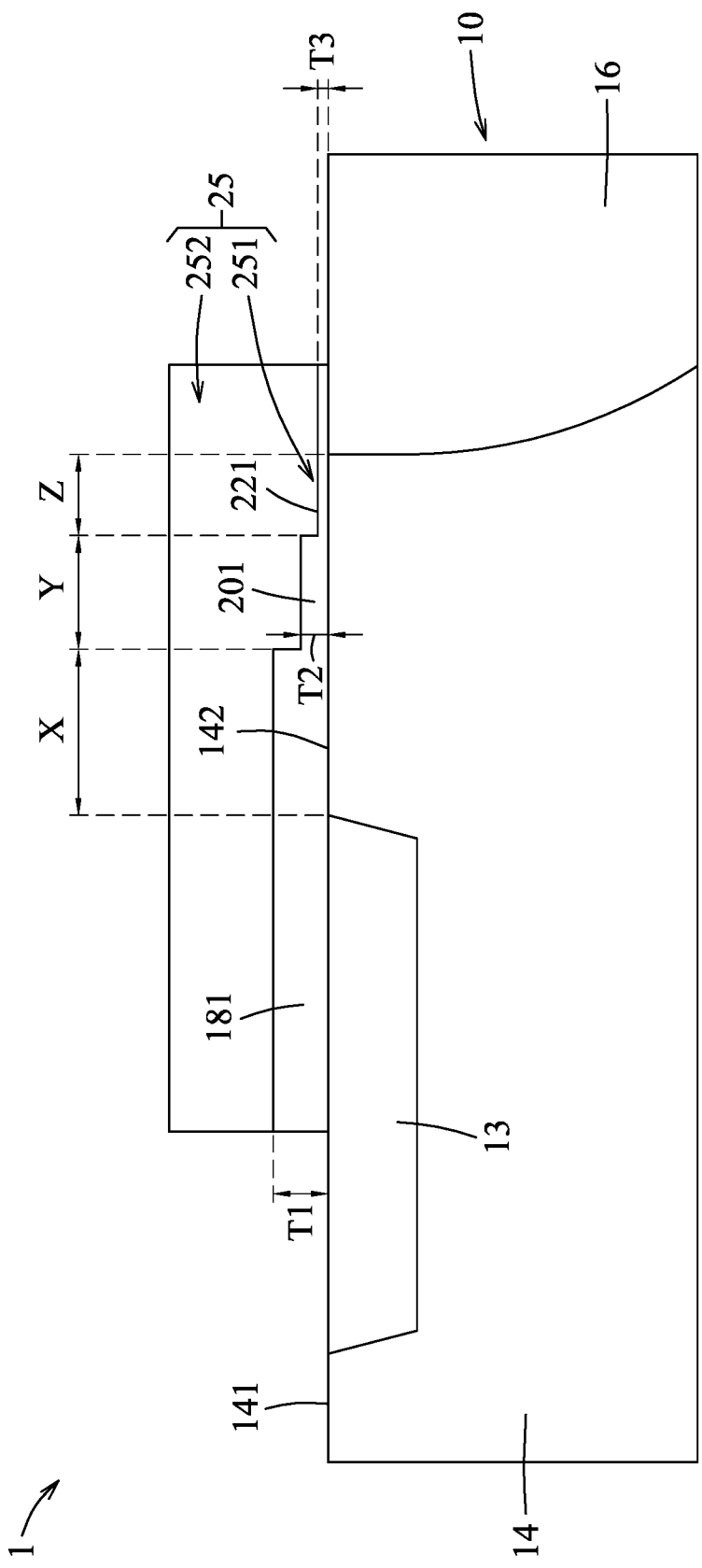
Figure 18:
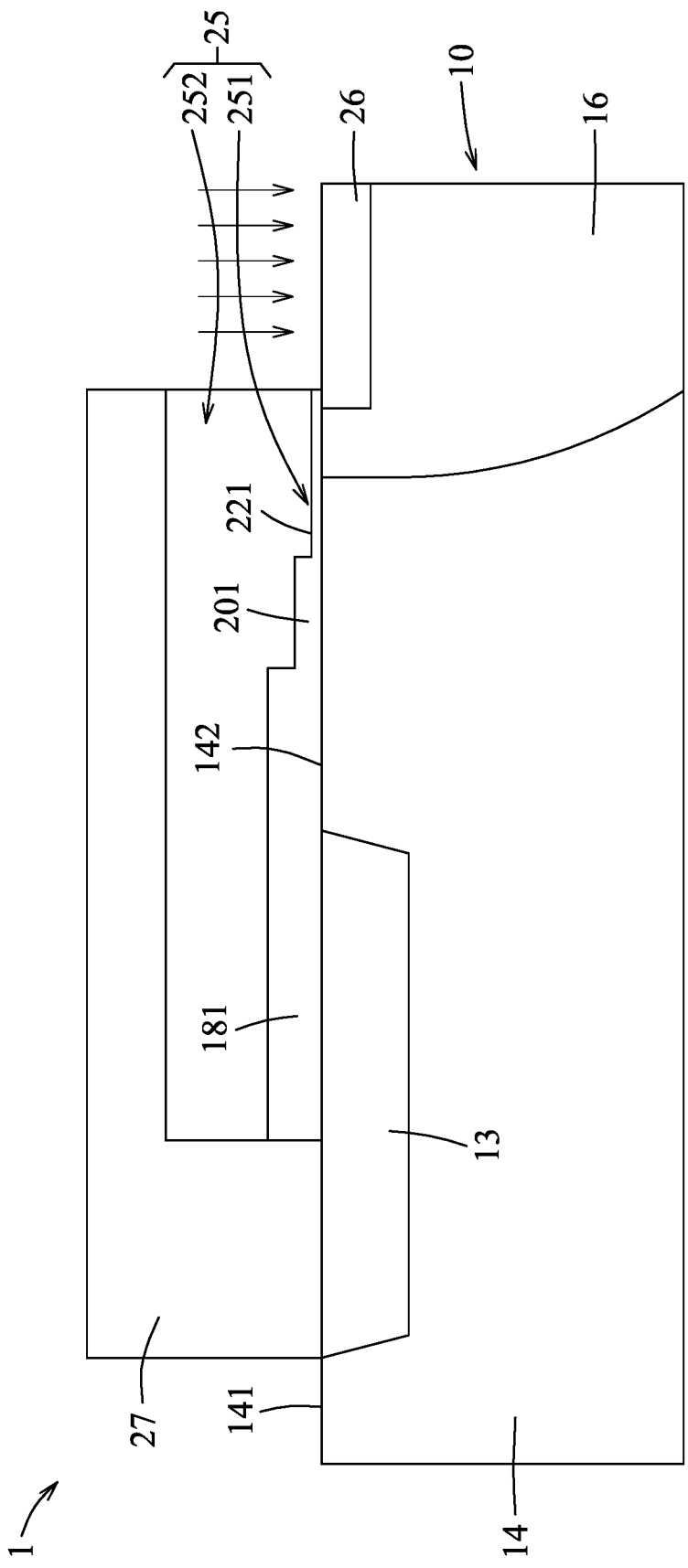
Figure 19:
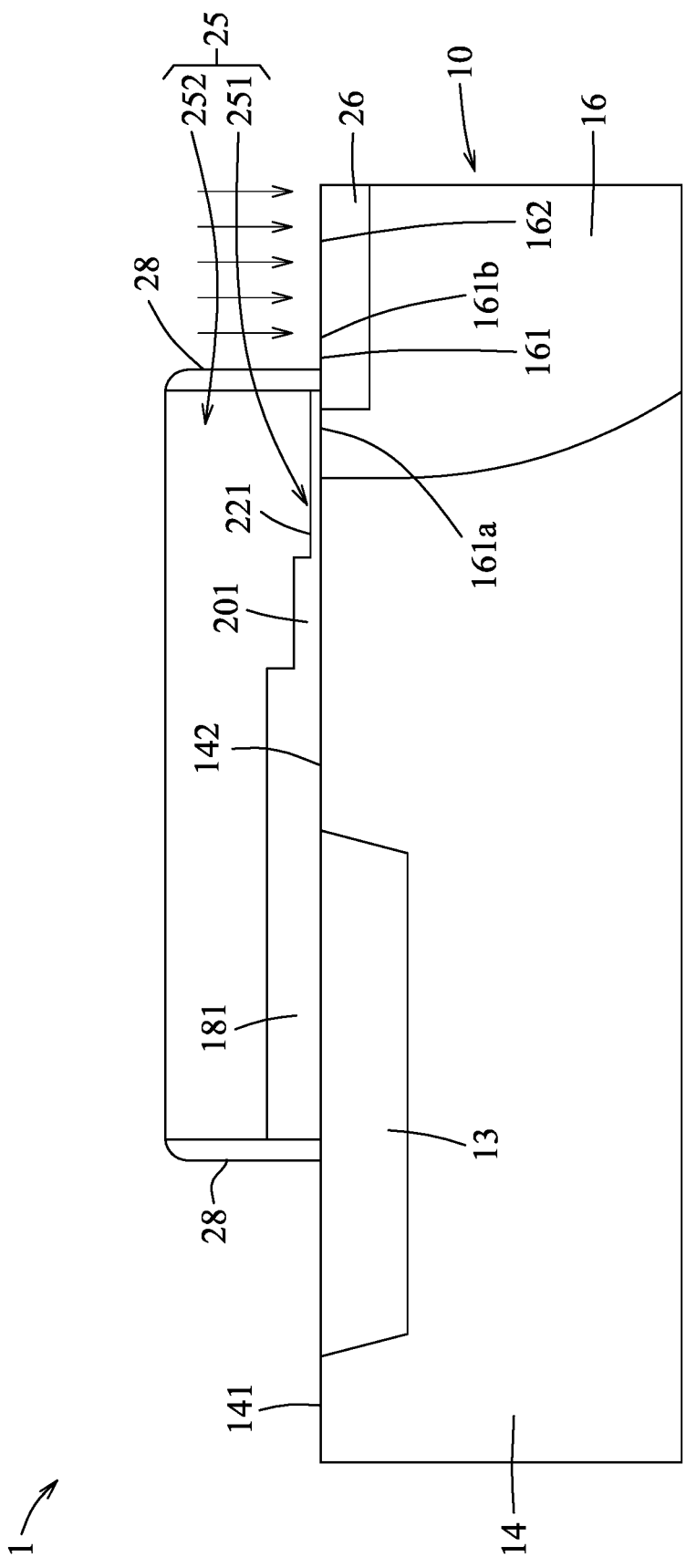
Figure 20:
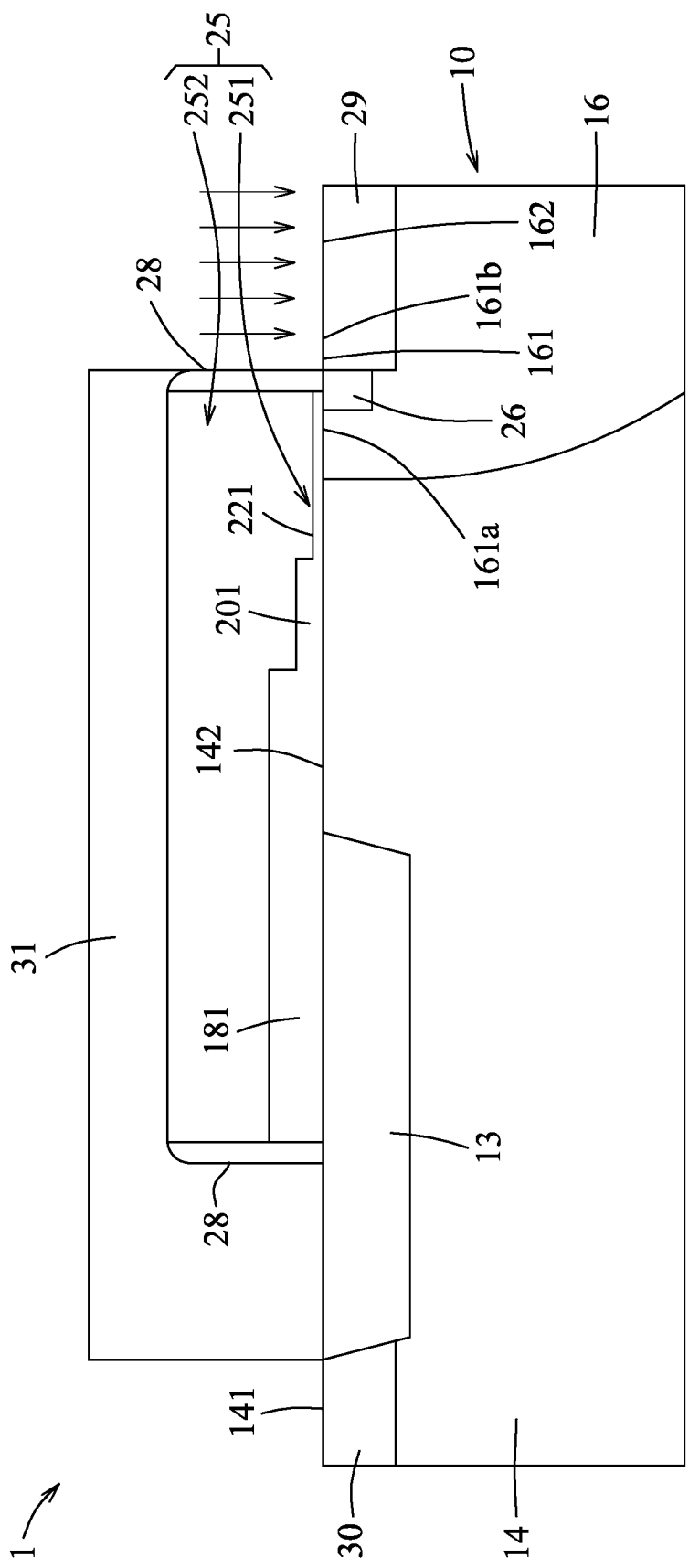

Referring to the example illustrated in FIG. 17, the gate structure 25 includes a multi-stepped gate dielectric 251 formed on the semiconductor layer 10, and a gate electrode 252 formed on the the multi-stepped gate dielectric 251. As illustrated in FIG. 17, in some embodiments, the multi-stepped gate dielectric 251 is a three-stepped gate dielectric, which includes the first gate dielectric segment 181, the second gate dielectric segment 201 physically connected to the first gate dielectric segment 181, and a third gate dielectric segment 221 physically connected to the second gate dielectric segment 201. The third gate dielectric segment 221 is formed from the third gate dielectric layer 22. In some alternative embodiments, the multi-stepped gate dielectric 251 may be a two-stepped gate dielectric which includes any two of the first, second, and third gate dielectric segments 181, 201, 221. In some alternative embodiments, the multi-stepped gate dielectric 251 may be a multi-stepped gate dielectric which includes the first gate dielectric segment 181, the second gate dielectric segment 201, the third gate dielectric segment 221, and one or more additional gate dielectric segments having thicknesses different from each other and different from those of the the first gate dielectric segment 181, the second gate dielectric segment 201, the third gate dielectric segment 221. The gate electrode 252 is formed from the gate electrode layer 23.

The first gate dielectric segment 181 has a first thickness (T1). The second gate dielectric segment 201 has a second thickness (T2), which is less than the first thickness (T1). The third gate dielectric segment 221 has a third thickness (T3), which is less than the second thickness (T2). In some embodiments, the first thickness (T1) ranges from 150 Å to 300 Å, the second thickness (T2) ranges from 130 Å to 200 Å, and the third thickness (T3) ranges from 100 Å to 150 Å. If the first, second, and third thicknesses (T1, T2, T3) are greater than the upper limits of the aforesaid ranges, respectively, the distance between the gate electrode 252 and a channel to be formed is increased undesirably, so that gate control may be lost, an on-current during a read operation may be decreased undesirably, and device drivability may be adversely affected. If the first, second, and third thicknesses (T1, T2, T3) are less than the lower limits of the aforesaid ranges, respectively, electric field may be increased undesirably and reliability may be adversely affected. In addition, the first gate dielectric segment 181 has a first length (X) defined between the STI region 13 and the second gate dielectric segment 201, the second gate dielectric segment 201 has a second length (Y) defined between the first gate dielectric segment 181 and the third gate dielectric segment 221, and the third gate dielectric segment 221 has a third length (Z) defined between the second gate dielectric segment 201 and the well region 16. In some embodiments, the first length (X) ranges from 0.3 μm to 0.7 μm, the second length (Y) ranges from 0.3 µm to 0.7 µm, and the third length (Z) ranges from 0.1 µm to 0.5 µm. The first, second, and third lengths (X, Y, Z) can be adjusted according to the practical application of the semiconductor device 1.

Referring to FIG. 1, the method 100 then proceeds to block 113, where a lightly doped region is formed in the semiconductor layer. Referring to the example illustrated in FIG. 18, a lightly doped region 26 is formed in the well region 16 by doping the well region 16 through a patterned mask 27 using an ion implantation process or other suitable processes. In some embodiments, the patterned mask 27 may be a patterned photoresist, which is formed by the process described above for the formation of the patterned photoresist used as the patterned mask 15 referred to FIG. 5. In some alternative embodiments, the patterned mask 27 may be a patterned hard mask. The lightly doped region 26 has the first conductivity type. In some embodiments, the lightly doped region 26 may be a lightly doped source/drain (LDD) region. After the lightly doped region 26 is formed, the patterned mask 27 is removed.

Referring to FIG. 1, the method 100 then proceeds to block 114, where sidewall spacers are formed. Referring to the example illustrated in FIG. 19, sidewall spacers 28 are formed on the semiconductor layer 10 to laterally cover the gate structure 25. The sidewall spacers 28 may include, for example, but not limited to, silicon oxide, silicon oxynitride, silicon nitride, or combinations thereof. Other suitable spacer materials are within the contemplated scope of the present disclosure. The sidewall spacers 28 may be formed by, for example, a process including (i) conformally depositing a spacer-forming layer (not shown) to cover the gate structure 25 and the semiconductor layer 10, and (ii) anisotropically etching the spacer-forming layer to remove horizontal portions of the spacer-forming layer on the gate structure 25 and the semiconductor layer 10.

Referring to FIG. 1, the method 100 then proceeds to block 115, where a source area and a drain area are formed. Referring to the example illustrated in FIGS. 20 and 21, a source area 29 and a drain area 30 are respectively formed within the well region 16 and the drift region 14, respectively. In some embodiments, the source area 29 and the drain area 30 have the first conductivity type, and thus may be formed using the above-mentioned N-type dopant for forming the N-type MOS device, or using the above-mentioned P-type dopant for forming the P-type MOS device. The source area 29 have a doping concentration higher than that of the lightly doped region 26. The drain area 30 may have a doping concentration higher than that of the drift region 14. Formation of the source area 29 and the drain area 30 may be implemented by (i) forming a patterned mask 31 on the semiconductor layer 10 to expose another part 161b of the first surface portion 161 and the second surface portion 162 of the well region 16 and to expose the first surface portion 141 of the drift region 14, and (ii) doping the well region 16 and the drift region 14 through the patterned mask 31 using an ion implantation process or other suitable processes so as to form the source area 29 within the well region 16 and the drain area 30 within the drift region 14. In some embodiments, the patterned mask 31 may be a patterned photoresist, which is formed by the process described above for the formation of the patterned photoresist used as the patterned mask 15 referred to FIG. 5. In some alternative embodiments, the patterned mask 24 may be a patterned hard mask. A portion of the lightly doped region 26 below the another part 161b of the first surface portion 161 of the well region 16 is further doped to form a portion of the source area 29 during the doping of the well region 16 to form the source 29. After the source area 29 and the drain area 30 are formed, the patterned mask 31 may be removed. In some embodiments, the source area 29 and the drain area 30 have the first conductivity type, and thus may be formed using the above-mentioned N-type dopant for forming the N-type MOS device, or using the above-mentioned P-type dopant for forming the P-type MOS device. In some embodiments, other suitable processes may be also used for forming the source area 29 and the drain area 30.

Figure 21:
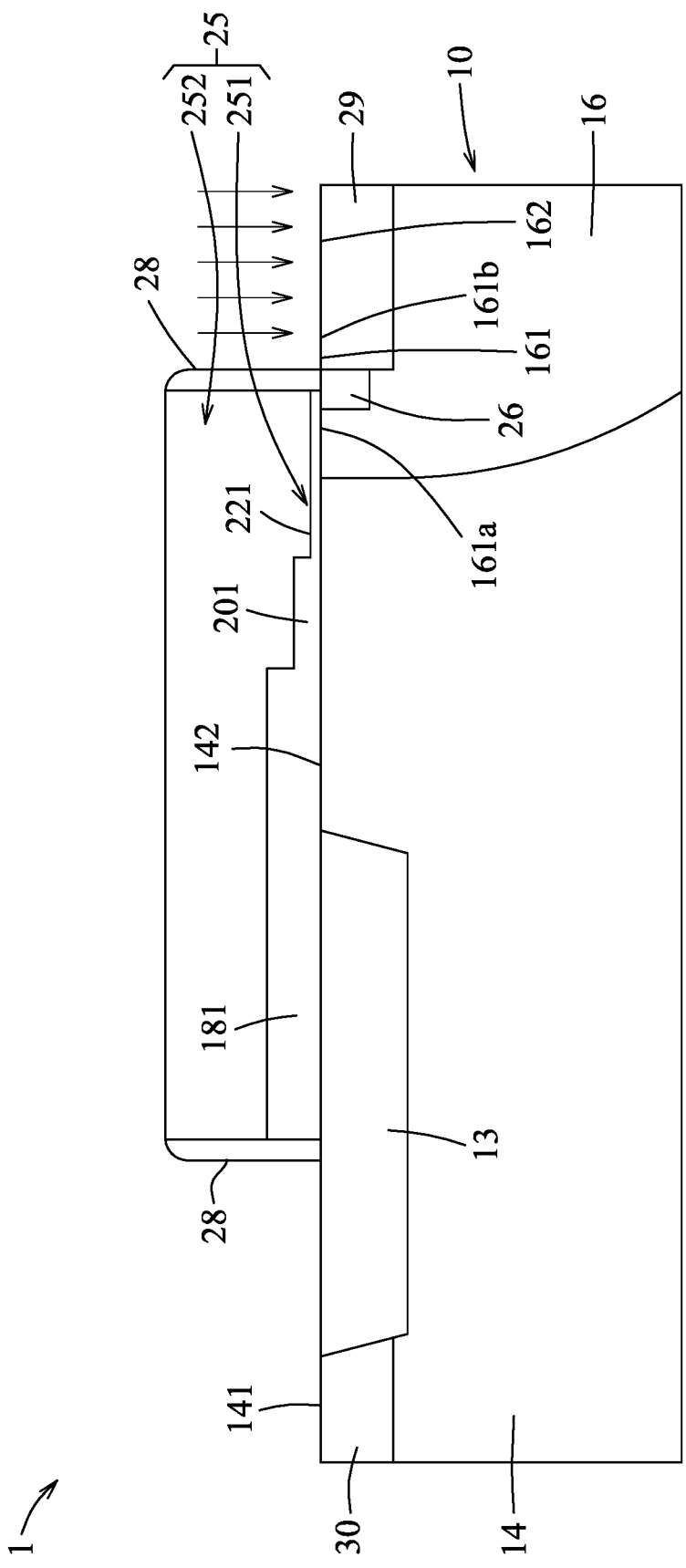

Referring to FIG. 21, during a read operation, an on-current flows from the source area 29, through the lightly doped region 26, a channel in the well region 16 and the drift region 14, and then into the drain area 30. In a portion of the drift region 14 between the STI region 13 and the well region 16, hot carriers generated by impact ionization accumulate gradually along a direction from the source area 29 to the drain area 30. Therefore, the greatest number of the hot carriers may accumulate at an area of the drift region 14 proximate to the STI region 13. The greater the number of the hot carriers in the drift region 14, the greater the possibility of causing undesirable injection of the hot carriers into the STI region 13 or other regions of the semiconductor device 1.

Figure 22:
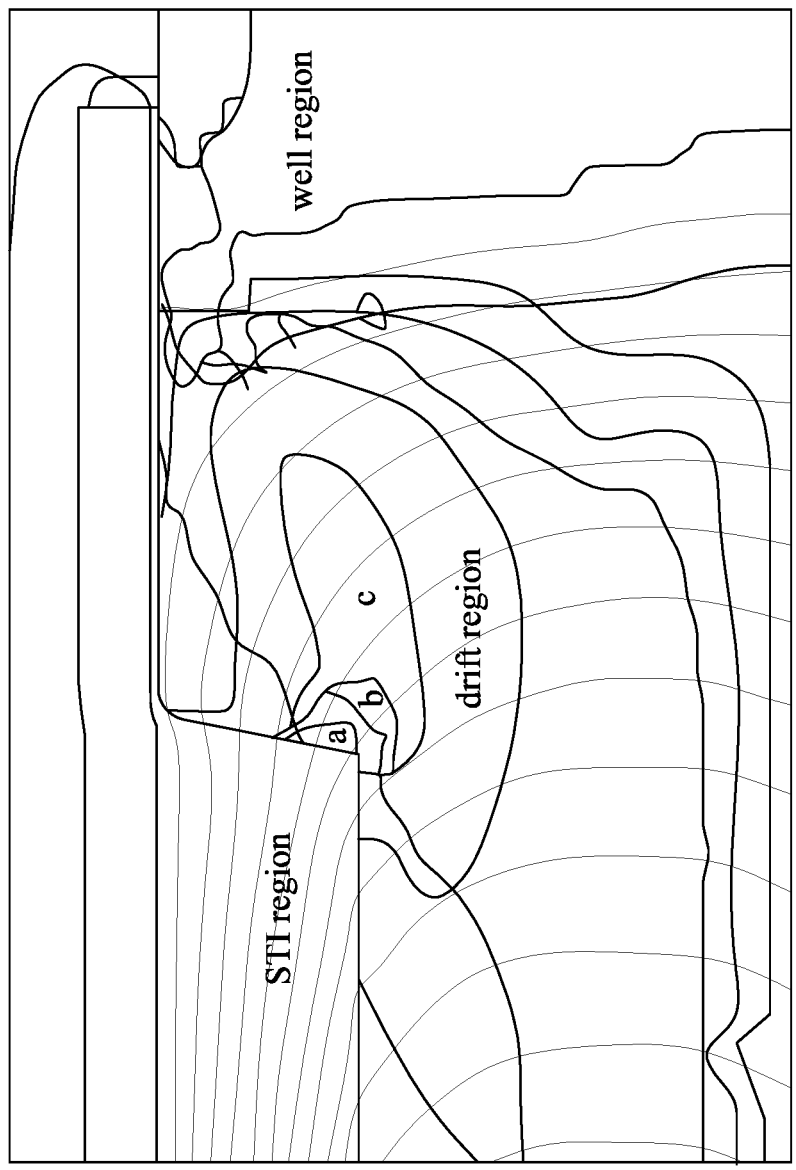
FIG. 22 is a simulation diagram illustrating the contour plots of the electric potential distribution and the hot carrier density of a semiconductor device in which a single-layered gate dielectric is provided.
Figure 23:
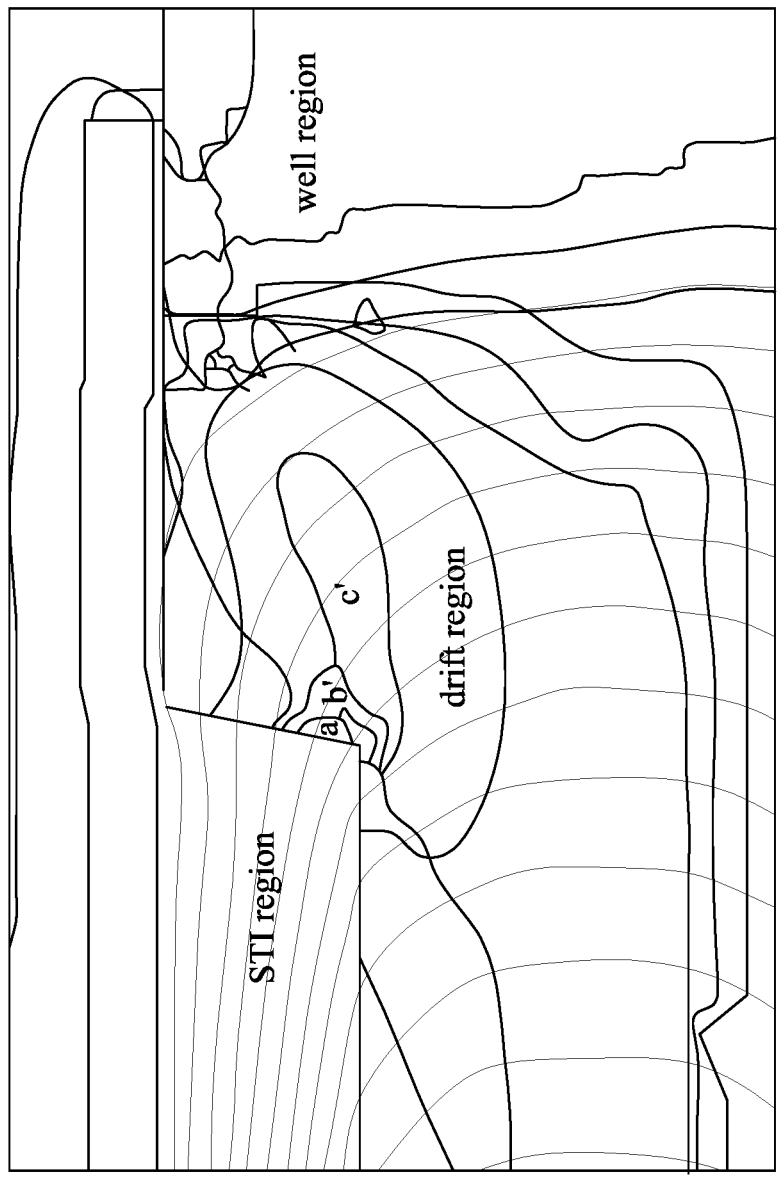
FIG. 23 is a simulation diagram illustrating the contour plots of the electric potential distribution and the hot carrier density of a semiconductor device in accordance with some embodiments in which a multi-stepped gate dielectric is provided.

FIG. 22 shows a simulation diagram illustrating the contour plots of the electric potential distribution and the hot carrier density of a semiconductor device in which a single-layered gate dielectric is provided. Area (a) has the greatest hot carrier density. Area (b) has a hot carrier density less than that of area (a). Area (c) has a hot carrier density less than that of area (b). FIG. 23 shows a simulation diagram illustrating the contour plots of the electric potential distribution and the hot carrier density of a semiconductor device in accordance with some embodiments in which a multi-stepped gate dielectric is provided. Area (a') has the greatest hot carrier density. Area (b') has a hot carrier density less than that of area (a'). Area (c') has a hot carrier density less than that of area (b'). The multi-stepped gate dielectric in the semiconductor device in accordance with some embodiments shown in FIG. 23 is a two-stepped gate dielectric, which includes a first gate dielectric segment and a second gate dielectric segment having a thickness less than that of the first gate dielectric segment. The single-layered gate dielectric in the semiconductor device shown in FIG. 22 has a thickness substantially the same as that of the second gate dielectric segment of the two-stepped gate dielectric in the semiconductor device in accordance with some embodiments shown in FIG. 23.

When the contour lines of the electric potential distribution are relatively dense, the impact ionization under a hot carrier operating condition is relatively significant and an area with a greater number of the hot carriers (i.e., an area with a greater hot carrier density) is increased in the drift region, which indicates that an excess of hot carriers is produced in the drift area that may damage the semiconductor device, degrade reliability, induce high leakage current, and cause the semiconductor device to malfunction. As shown in FIGS. 22 and 23, the contour lines of the electric potential distribution of the semiconductor device in accordance with some embodiments of the disclosure in which a two-stepped gate dielectric is provided are relatively loose, compared to the contour lines of the electric potential distribution of the semiconductor device in which a single-layered gate dielectric is provided. In addition, an area (a') with the greatest hot carrier density in the drift region of the semiconductor device in accordance with some embodiments of the disclosure in which a two-stepped gate dielectric is provided is relatively small, compared to an area (a)

with the greatest hot carrier density in the drift region of the semiconductor device in which a single-layered gate dielectric is provided. Moreover, a total size of areas (a', b', c') in the drift region of the semiconductor device in accordance with some embodiments of the disclosure in which a two-stepped gate dielectric is provided is relatively small, compared to a total size of areas (a, b, c) in the drift region of the semiconductor device in which a single-layered gate dielectric is provided. Therefore, it is indicated from the simulation diagrams shown in FIGS. 22 and 23 that the impact ionization under the hot carrier operating condition can be reduced in the drift region of the semiconductor device of the disclosure by forming the multi-stepped gate dielectric in the semiconductor device. Therefore, the abovementioned issue of producing an excess of the hot carriers to damage the semiconductor device, degrade reliability, induce high leakage current, and cause the semiconductor device to malfunction can be alleviated.

In the semiconductor device 1 of this disclosure, the multi-stepped gate dielectric 251 is provided, which includes at least two of the gate dielectric segments 181, 201, 221 having stepwise increasing heights. Therefore, the impact ionization under the hot carrier operating condition can be reduced, so that the area with the great hot carrier density in the drift region 14 of the semiconductor device 1 can be decreased. Therefore, the issue of producing an excess of the hot carriers to damage the semiconductor device, degrade reliability, induce high leakage current, and cause the semiconductor device to malfunction can be alleviated.

In accordance with some embodiments of the present disclosure, a semiconductor device includes a semiconductor layer and a gate structure on the semiconductor layer. The gate structure includes a multi-stepped gate dielectric on the semiconductor layer and a gate electrode on the multi-stepped gate dielectric. The multi-stepped gate dielectric includes a first gate dielectric segment having a first thickness and a second gate dielectric segment having a second thickness that is less than the first thickness.

In accordance with some embodiments of the present disclosure, the multi-stepped gate dielectric further includes a third gate dielectric segment having a third thickness that is less than the second thickness.

In accordance with some embodiments of the present disclosure, the first thickness ranges from 150 Å to 300 Å.

In accordance with some embodiments of the present disclosure, the second thickness ranges from 130 Å to 200 Å.

In accordance with some embodiments of the present disclosure, the third thickness ranges 100 Å to 150 Å.

In accordance with some embodiments of the present disclosure, the semiconductor device further includes a drift region in the semiconductor layer and having a first conductivity type, a well region in the semiconductor layer and having a second conductivity type opposite the first conductivity type, a dielectric film in the drift region, a source area in the well region and having the first conductivity type, and a drain area in the drift region such that the dielectric film is located between the source area and the drain area.

In accordance with some embodiments of the present disclosure, the drain has the first conductivity type and having a doping concentration higher than that of the drift region.

In accordance with some embodiments of the present disclosure, the first gate dielectric segment has a first length defined between the dielectric film and the second gate dielectric segment, the first length ranging from 0.3 μm to 0.7 μm.

In accordance with some embodiments of the present disclosure, the second gate dielectric segment has a second length defined between the first gate dielectric segment and the third gate dielectric segment, the second length ranging from 0.3 μm to 0.7 μm.

In accordance with some embodiments of the present disclosure, the third gate dielectric segment has a third length defined between the second gate dielectric segment and the well region, the third length ranging from 0.1 μm to 0.5 μm.

In accordance with some embodiments of the present disclosure, a semiconductor device includes a semiconductor layer, a drift region in the semiconductor layer and having a first conductivity type, a well region in the semiconductor layer and having a second conductivity type opposite the first conductivity type, a dielectric film in the drift region, and a gate structure on the semiconductor layer. The gate structure includes a multi-stepped gate dielectric and a gate electrode on the multi-stepped gate dielectric. The multi-stepped gate dielectric includes a first gate dielectric segment on the dielectric film and the drift region, and a second gate dielectric segment on the drift region and physically connected to the first gate dielectric segment. The first gate dielectric segment has a first thickness. The second gate dielectric segment has a second thickness that is less than the first thickness.

In accordance with some embodiments of the present disclosure, the multi-stepped gate dielectric further includes a third gate dielectric segment on the drift region and the well region and physically connected to the second gate dielectric segment. The third gate dielectric segment has a third thickness that is less than the second thickness.

In accordance with some embodiments of the present disclosure, the first thickness ranges from 150 Å to 300 Å.

In accordance with some embodiments of the present disclosure, the second thickness ranges from 130 Å to 200 Å.

In accordance with some embodiments of the present disclosure, the third thickness ranges 100 Å to 150 Å.

In accordance with some embodiments of the present disclosure, the semiconductor device further includes a source area in the well region and having the first conductivity type, and a drain area in the drift region such that the dielectric film is located between the source area and the drain area. The drain area has the first conductivity type.

In accordance with some embodiments of the present disclosure, a method for manufacturing a semiconductor device includes forming a first gate dielectric layer on a semiconductor layer; patterning the first gate dielectric layer to form a first gate dielectric segment on the semiconductor layer, the first gate dielectric segment having a first thickness; forming a second gate dielectric layer on the semiconductor layer; patterning the second gate dielectric layer to form a second gate dielectric segment on the semiconductor layer, the second gate dielectric segment having a second thickness that is less than the first thickness; forming a gate electrode layer on the first gate dielectric segment and the second gate dielectric segment; and patterning the gate electrode layer to form a gate electrode on the first gate dielectric segment and the second gate dielectric segment.

In accordance with some embodiments of the present disclosure, the method for manufacturing a semiconductor device further includes, prior to forming the gate electrode layer, forming a third gate dielectric layer on the semiconductor layer, such that when the gate electrode layer is patterned to form the gate electrode, the third gate dielectric layer is patterned to form a third gate dielectric segment and the gate electrode thus formed is on the first gate dielectric segment, the second gate dielectric segment, and the third gate dielectric segment. The third gate dielectric segment has a third thickness less than the second thickness.

In accordance with some embodiments of the present disclosure, the method for manufacturing a semiconductor device further includes forming a dielectric film in the semiconductor layer; forming a drift region in the semiconductor layer such that the dielectric film is located in the drift region, the drift region having a first conductivity type; and forming a well region in the semiconductor layer, the well region having a second conductivity type opposite the first conductivity type.

In accordance with some embodiments of the present disclosure, the method for manufacturing a semiconductor device further includes forming a source area in the well region such that the source area is separated from the drift region by the well region, the source area having the first conductivity type; and forming a drain area in the drift region such that the dielectric film is located between the source area and the drain area, the drain area having the first conductivity type.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor layer having an upper surface;
   a dielectric film disposed in the semiconductor layer; and
   a gate structure disposed on the semiconductor layer, and including:
      a multi-stepped gate dielectric disposed on the semiconductor layer, and including a first gate dielectric portion and a second gate dielectric portion connected to the first gate dielectric portion, the first gate dielectric portion having a flat upper surface, the second gate dielectric portion having a stepped upper surface that includes a flat upper surface portion connected to and flush with the flat upper surface of the first gate dielectric portion, and
      a gate electrode disposed on the multi-stepped gate dielectric,
   wherein a projection of the dielectric film on the upper surface of the semiconductor layer is non-overlapping with a projection of the second gate dielectric portion on the upper surface of the semiconductor layer, and
   wherein the projection of the dielectric film on the upper surface of the semiconductor layer is connected to the projection of the second gate dielectric portion on the upper surface of the semiconductor layer.

2. A semiconductor device comprising:
   a semiconductor layer having an upper surface;
   a drift region disposed in the semiconductor layer and having a first conductivity type;
   a well region disposed in the semiconductor layer and having a second conductivity type opposite the first conductivity type;
   a dielectric film disposed in the drift region; and
   a gate structure disposed on the semiconductor layer and including:
      a multi-stepped gate dielectric including a first gate dielectric portion and a second gate dielectric portion connected to the first gate dielectric portion, the first gate dielectric portion having a flat upper surface, the second gate dielectric portion having a stepped upper surface that includes a flat upper surface portion connected to and flush with the flat upper surface of the first gate dielectric portion, and
      a gate electrode disposed on the multi-stepped gate dielectric,
   wherein a projection of the dielectric film on the upper surface of the semiconductor layer is non-overlapping with a projection of the second gate dielectric portion on the upper surface of the semiconductor layer, and
   wherein the multi-stepped gate dielectric includes a first gate dielectric segment disposed on the dielectric film and the drift region, a second gate dielectric segment disposed on the drift region and connected to the first gate dielectric segment, and a third gate dielectric segment disposed on the drift region and the well region and connected to the second gate dielectric segment, the first gate dielectric segment having a first thickness, the second gate dielectric segment having a second thickness that is less than the first thickness, the third gate dielectric segment having a third thickness that is less than the second thickness.

3. The semiconductor device according to claim 2, wherein the first thickness ranges from 150 Å to 300 Å.

4. The semiconductor device according to claim 2, wherein the second thickness ranges from 130 Å to 200 Å.

5. The semiconductor device according to claim 2, wherein the third thickness ranges 100 Å to 150 Å.

6. The semiconductor device according to claim 1, wherein the first gate dielectric portion overlaps the dielectric film, and the second gate dielectric portion is non-overlapping with the dielectric film and is in contact with the semiconductor layer.

7. The semiconductor device according to claim 1, wherein the multi-stepped gate dielectric includes a first gate dielectric segment having a first thickness, and a second gate dielectric segment connected to the first gate dielectric segment and having a second thickness that is less than the first thickness.

8. The semiconductor device according to claim 7, wherein the multi-stepped gate dielectric further includes a third gate dielectric segment having a third thickness that is less than the second thickness, the second gate dielectric segment being connected between the first gate dielectric segment and the third gate dielectric segment.

9. The semiconductor device according to claim 8, wherein the first gate dielectric segment includes a first gate dielectric part overlapped with the dielectric film and a second gate dielectric part non-overlapping with the dielectric film and connected between the first gate dielectric part and the second gate dielectric segment.

10. The semiconductor device according to claim 9, wherein the second gate dielectric portion includes the second gate dielectric part of the first gate dielectric segment, the second gate dielectric segment, and the third gate dielectric segment.

11. The semiconductor device according to claim 2, wherein the first gate dielectric segment includes a first gate dielectric part overlapping the dielectric film and a second gate dielectric part non-overlapping with the dielectric film and connected between the first gate dielectric part and the second gate dielectric segment.

12. The semiconductor device according to claim 11, wherein the first gate dielectric part of the first gate dielectric segment is in contact with the dielectric film, the second gate dielectric part of the first gate dielectric segment is in contact with the drift region, the second dielectric segment is in contact with the drift region, and the third dielectric segment is in contact with the drift region and the well region.

13. The semiconductor device according to claim 2, wherein the first gate dielectric segment has a first length defined between the dielectric film and the second gate dielectric segment, the first length ranging from 0.3 μm to 0.7 μm.

14. The semiconductor device according to claim 2, wherein the second gate dielectric segment has a second length defined between the first gate dielectric segment and the third gate dielectric segment, the second length ranging from 0.3 μm to 0.7 μm.

15. The semiconductor device according to claim 2, wherein the third gate dielectric segment has a third length defined between the second gate dielectric segment and the well region, the third length ranging from 0.1 μm to 0.5 μm.

16. A semiconductor device comprising:
- a semiconductor layer having an upper surface;
- a drift region disposed in the semiconductor layer and having a first conductivity type;
- a well region disposed in the semiconductor layer and having a second conductivity type opposite the first conductivity type;
- a dielectric film disposed in the drift region; and
- a gate structure disposed on the semiconductor layer and including:
  - a multi-stepped gate dielectric including a first gate dielectric portion and a second gate dielectric portion connected to the first gate dielectric portion, the first gate dielectric portion having a flat upper surface, the second gate dielectric portion having a stepped upper surface that includes a flat upper surface portion connected to and flush with the flat upper surface of the first gate dielectric portion, and
  - a gate electrode disposed on the multi-stepped gate dielectric, wherein a projection of the dielectric film on the upper surface of the semiconductor layer is non-overlapping with a projection of the second gate dielectric portion on the upper surface of the semiconductor layer, and wherein the first gate dielectric portion overlaps the dielectric film, and the second gate dielectric portion is non-overlapping with the dielectric film and is in contact with the drift region and the well region.

17. The semiconductor device according to claim 16, wherein the multi-stepped gate dielectric includes a first gate dielectric segment disposed on the dielectric film and the drift region, a second gate dielectric segment disposed on the drift region and connected to the first gate dielectric segment, and a third gate dielectric segment disposed on the drift region and the well region and connected to the second gate dielectric segment, the first gate dielectric segment having a first thickness, the second gate dielectric segment having a second thickness that is less than the first thickness, the third gate dielectric segment having a third thickness that is less than the second thickness.

18. The semiconductor device according to claim 17, wherein the first thickness ranges from 150 Å to 300 Å.

19. The semiconductor device according to claim 17, wherein the second thickness ranges from 130 Å to 200 Å.

20. The semiconductor device according to claim 17, wherein the third thickness ranges 100 Å to 150 Å.

\* \* \* \* \*